(12) United States Patent
Ko et al.

(10) Patent No.: US 11,976,797 B2
(45) Date of Patent: May 7, 2024

(54) LIGHTING DEVICE AND LAMP COMPRISING SAME

(71) Applicant: LG INNOTEK CO., LTD., Seoul (KR)

(72) Inventors: Kwang Hyun Ko, Seoul (KR); Moo Ryong Park, Seoul (KR); Dong Hyun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/021,844

(22) PCT Filed: Aug. 24, 2021

(86) PCT No.: PCT/KR2021/011242
§ 371 (c)(1),
(2) Date: Feb. 17, 2023

(87) PCT Pub. No.: WO2022/045714
PCT Pub. Date: Mar. 3, 2022

(65) Prior Publication Data
US 2023/0220968 A1    Jul. 13, 2023

(30) Foreign Application Priority Data
Aug. 26, 2020    (KR) .................. 10-2020-0107502

(51) Int. Cl.
*F21S 41/36*    (2018.01)
*F21S 41/32*    (2018.01)
(Continued)

(52) U.S. Cl.
CPC ............ *F21S 41/36* (2018.01); *F21S 41/321* (2018.01); *F21S 41/37* (2018.01); *F21S 41/50* (2018.01);
(Continued)

(58) Field of Classification Search
CPC .......... F21S 41/321; F21S 41/37; F21V 7/05; F21V 7/22; F21W 2103/60; F21Y 2105/18
(Continued)

(56) References Cited

U.S. PATENT DOCUMENTS

| | | |
|---|---|---|
| 1,038,143 A | 9/1912 | Hutchison |
| 10,763,315 B2 | 9/2020 | Bang et al. |

(Continued)

FOREIGN PATENT DOCUMENTS

| | | | |
|---|---|---|---|
| JP | 2020-9905 A | | 1/2020 |
| KR | 20080057524 A | * | 6/2008 |

(Continued)

OTHER PUBLICATIONS

English Machine Translation of the ISA Written Opinion of PCT/KR2021/011242 (dated 2021).*

*Primary Examiner* — Keith G. Delahoussaye
(74) *Attorney, Agent, or Firm* — Birch, Stewart, Kolasch & Birch, LLP

(57) ABSTRACT

A lighting device according to an embodiment includes a sensor, a substrate disposed on the sensor and including an electrode pattern, a light source disposed on the substrate and electrically connected to the electrode pattern, a resin layer disposed on the substrate, and a reflective layer disposed between the substrate and the resin layer, and the substrate may include a first region overlapping the sensor in a first direction perpendicular to an upper surface of the substrate, a second region surrounding the first region, the light source may be disposed on the second region, the plurality of reflective pattern groups may be disposed on the first region, and the sensor may not overlap the light source and the electrode pattern in the first direction.

20 Claims, 14 Drawing Sheets

(51) Int. Cl.
*F21S 41/37* (2018.01)
*F21S 41/50* (2018.01)
*F21S 43/31* (2018.01)
*F21S 43/33* (2018.01)
*F21V 7/05* (2006.01)
*F21V 7/22* (2018.01)
*F21V 19/00* (2006.01)
*F21V 23/04* (2006.01)
*F21Y 105/18* (2016.01)
*F21Y 107/50* (2016.01)

(52) U.S. Cl.
CPC .............. *F21S 43/31* (2018.01); *F21S 43/33* (2018.01); *F21V 7/05* (2013.01); *F21V 7/22* (2013.01); *F21V 19/0015* (2013.01); *F21V 23/0442* (2013.01); *F21Y 2105/18* (2016.08); *F21Y 2107/50* (2016.08)

(58) Field of Classification Search
USPC .................................................. 362/516, 60
See application file for complete search history.

(56) References Cited

U.S. PATENT DOCUMENTS

| | | |
|---|---|---|
| 11,417,807 B2 * | 8/2022 | Kim ................. H01L 33/504 |
| 2004/0028756 A1 | 2/2004 | Yoshida et al. |
| 2012/0154785 A1 | 6/2012 | Gilliland et al. |
| 2017/0268734 A1 * | 9/2017 | Kawaguchi ........... F21V 23/005 |
| 2018/0326895 A1 * | 11/2018 | Chae ................. F21S 43/40 |
| 2019/0212004 A1 * | 7/2019 | Van Bommel ........... F21S 4/24 |
| 2020/0104563 A1 | 4/2020 | Ryu et al. |

FOREIGN PATENT DOCUMENTS

| | | |
|---|---|---|
| KR | 10-2009-0081452 A | 7/2009 |
| KR | 10-1777898 B1 | 9/2017 |
| KR | 10-2020-0036684 A | 4/2020 |
| KR | 10-2020-0037653 A | 4/2020 |
| KR | 10-2020-0069421 A | 6/2020 |

* cited by examiner (a)      (b)

LIGHTING DEVICE AND LAMP COMPRISING SAME

CROSS REFERENCE TO RELATED APPLICATIONS

This application is the National Phase of PCT International Application No. PCT/KR2021/011242, filed on Aug. 24, 2021, which claims priority under 35 U.S.C. 119(a) to Patent Application No. 10-2020-0107502, filed in the Republic of Korea on Aug. 26, 2020, all of which are hereby expressly incorporated by reference into the present application.

TECHNICAL FIELD

The embodiment relates to a lighting device and a lamp including the same.

BACKGROUND ART

Lighting is a device capable of supplying light or controlling the amount of light and is used in various fields. For example, the lighting device may be applied to various fields such as vehicles and buildings to illuminate the interior or exterior. In particular, in recent years, a light emitting device has been used as a light source for lighting. Such a light emitting device, for example, a light emitting diode (LED), has advantages such as low power consumption, semi-permanent lifespan, fast response speed, safety, environmental friendliness compared to conventional light sources such as fluorescent lamps and incandescent lamps. Such light emitting diode is being applied to various optical assemblies such as various display devices, indoor lights, or outdoor lights.

In general, lamps of various colors and shapes are applied to vehicles, and lamps employing light emitting diodes as light sources for vehicles have recently been proposed. For example, light emitting diodes are applied to vehicle headlights, taillights, direction indicators, and the like. However, these light emitting diodes have a problem in that the emission angle of emitted light is relatively small. For this reason, when using a light emitting diode as a vehicle lamp, there is a demand for increasing the light emitting area of the lamp.

A logo or emblem having a phrase or shape symbolizing a manufacturer or brand of the vehicle is placed in front of the vehicle, and research into applying a lamp to the logo or emblem is currently being conducted. The logo or emblem is generally located on the front of a vehicle, for example, on a radiator grill. However, when a lamp is applied to the logo, there is a problem of causing interference to a detection sensor located in the front of the vehicle. In detail, a detection sensor including a radar or lidar for detecting an object located in the front may be disposed in front of the vehicle. In this case, when the logo lamp is disposed adjacent to or overlaps with the detection sensor, a signal emitted from the detection sensor may cause interference by a component included in the lamp. Accordingly, it may be difficult to effectively detect an object located in the front, and it may be difficult to effectively provide information to a vehicle occupant.

When the lamp includes the light emitting diode, there is a problem in that a hot spot phenomenon in which light is concentrated on light emitted from the light emitting diode occurs. In this case, when implementing a linear light source or a surface light source using the lamp, there is a problem in that uniformity characteristics of the light emitting surface are deteriorated. Therefore, a new lighting device and lamp capable of solving the above problems are required.

DISCLOSURE

Technical Problem

An embodiment provides a lighting device and a lamp having improved luminous intensity. An embodiment provides a lighting device and a lamp capable of realizing a uniform line light source or a surface light source. An embodiment provides a lighting device and a lamp capable of preventing interference with a sensor.

Technical Solution

A lighting device according to an embodiment includes a sensor, a substrate disposed on the sensor and including an electrode pattern, a light source disposed on the substrate and electrically connected to the electrode pattern, a resin layer disposed on the substrate, and a reflective layer disposed between the substrate and the resin layer and including a plurality of reflective pattern groups, and the substrate may include a first region overlapping the sensor in a first direction perpendicular to an upper surface of the substrate and a second region surrounding the first region, the light source may be disposed on the second region, the plurality of reflective pattern groups may be disposed on the first region, and the sensor may not overlap the light source and the electrode pattern in the first direction.

According to the embodiment of the invention, each of the plurality of reflective pattern groups may include a plurality of unit reflective patterns. The second region may include a 2-1 region where the light source is disposed and a 2-2 region disposed between the first region and the 2-1 region, and the plurality of unit reflective patterns may be further disposed on the 2-2 region. A maximum interval between the plurality of unit reflective patterns disposed on the first region may be smaller than a maximum interval between the plurality of unit reflective patterns disposed on the 2-2 region. A size of the plurality of unit reflective patterns disposed on the first region may be larger than a size of the plurality of unit reflective patterns disposed on the 2-2 region.

According to the embodiment of the invention, the plurality of unit reflective patterns may not overlap the 2-1 region in the first direction.

A lighting device according to an embodiment includes a sensor, a substrate disposed on the sensor and including an electrode pattern, a light source disposed on the substrate and electrically connected to the electrode pattern, a resin layer disposed on the substrate, and a reflective layer disposed between the substrate and the resin layer and including a plurality of unit reflective patterns, the substrate includes a first region including a center of the substrate and a second region including an edge of the substrate, the light source is disposed on the second region and including first and second light emitting devices disposed to correspond to each other with respect to the center of the substrate and emitting light toward the center of the substrate, a portion of the plurality of unit reflective patterns may overlap the first and second light emitting devices in a second direction defined in a horizontal direction, the plurality of unit reflective patterns may be disposed on the first region, and the sensor may overlap the first region perpendicular to the second direction and may not overlap the electrode pattern in the first direction.

According to the embodiment of the invention, the light source may include a plurality of light emitting devices arranged at regular intervals along the edge of the substrate. The light source may include a light emitting group defined as a pair of light emitting devices facing each other among the plurality of light emitting devices, and at least one light emitting group may be disposed on the substrate. The plurality of light emitting devices may be disposed along a virtual line forming a polygonal shape, a circular shape, or an elliptical shape.

A lighting device according to the embodiment includes a sensor, a substrate disposed on the sensor and including an electrode pattern, a light source disposed on the substrate and electrically connected to the electrode pattern, a resin layer disposed on the substrate, and a reflective layer disposed between the substrate and the resin layer, the reflective layer may include first to third reflective pattern groups disposed along virtual first to third lines in a polygonal, circular, or elliptical shape, the second line may be disposed inside the first line, the third line may be disposed inside the second line, and the sensor may not overlap the light source and the electrode pattern in a vertical direction.

According to an embodiment of the invention, the first reflective pattern group includes a plurality of first unit reflective patterns disposed along the first line, and the second reflective pattern group includes a plurality of second unit reflective patterns disposed along the second line, and the third reflective pattern group may include a plurality of third unit reflective patterns disposed along the third line.

According to the embodiment of the invention, a size of the first unit reflective pattern may be smaller than a size of the second unit reflective pattern, and a size of the second unit reflective pattern may be smaller than a size of the third unit reflective pattern. A density of the third unit reflective patterns included in the third reflective pattern group may be greater than a density of the second unit reflective patterns included in the second reflective pattern group, and the density of the second unit reflective pattern included in the first reflective pattern group may be greater than the density of the second unit reflective patterns included in the first unit reflective pattern group. A distance between the plurality of first reflective patterns on the center of the substrate may be constant or change in a clockwise direction. The light source may not be disposed in the first region. The reflective layer may include an optical sheet, and the plurality of unit reflective patterns may not be disposed on the optical sheet. An optical member disposed on the resin layer and including a transmissive region and a non-transmissive region may be included, and the optical member may be spaced apart from the resin layer.

According to the embodiment of the invention, a separation distance between the substrate and the sensor may be greater than a separation distance between the resin layer and the optical member. A light blocking layer disposed on the resin layer may include, the light blocking layer includes a first substrate and a light blocking pattern disposed on the first substrate, and a part of the light blocking pattern may overlap the light source in a vertical direction.

The lighting device according to the embodiment includes a sensor, a substrate spaced apart from the sensor and including an electrode pattern, a light source disposed on the substrate and electrically connected to the electrode pattern, a resin layer disposed on the substrate, and a light blocking layer including a light blocking pattern, and the sensor may overlap the substrate and the resin layer based on a first direction perpendicular to an upper surface of the substrate, and may not overlap the electrode pattern, the light source, and the light blocking pattern based on the first direction.

According to the embodiment of the invention, the light source may include a plurality of light emitting devices disposed on an edge of the substrate, and a light emitting group defined as a pair of light emitting devices which light emitting surfaces face each other among the plurality of light emitting devices, and a plurality of light emitting groups may be disposed on the substrate. A pair of light emitting devices included in one light emitting group selected from the plurality of light emitting groups may be spaced apart by a first distance, one light emitting device included in the one light emitting group and one light emitting device included in the other light emitting group may be spaced apart by a second distance, and the first distance may be greater than the second distance.

According to an embodiment of the invention, a housing disposed between the sensor and the substrate, and a reflective layer disposed between the housing and the resin layer and having a plurality of unit reflective patterns are included, and the substrate may include opening penetrating an upper surface and a lower surface, the opening may be formed in a center region of the substrate overlapping the sensor in the first direction, and the reflective layer may be disposed on the housing corresponding to the opening. An upper surface of the reflective layer may be disposed lower than the upper surface of the substrate.

Advantageous Effects

The lighting device and lamp according to the embodiment may effectively sense an object using a sensor and provide uniform light at the same time. In detail, the lighting device may include a light source module disposed to overlap the sensor, and the light source module may be disposed such that a component causing interference with the sensor is not overlapped with the sensor. Accordingly, the lighting device may simultaneously perform light emission and object detection using the sensor, and detection accuracy may be prevented from being deteriorated due to interference of the sensor by the light source module.

The lighting device and lamp may have improved light characteristics. In detail, the lighting device and the lamp may include a reflective layer including a plurality of unit reflective patterns, and the plurality of unit reflective patterns may be disposed having characteristics such as a set position, width, distance, pitch interval, and density. Accordingly, the reflective layer may minimize light loss by effectively reflecting the light emitted from the light source, and provide a linear light source or a surface light source with uniform luminance in an upward direction.

The lighting device and the lamp may improve luminance uniformity characteristics of emitted light. In detail, the lighting device may include a light blocking layer, and the light blocking layer may include a light blocking pattern disposed in a region where light emitted from a light source is concentrated. At this time, the light blocking pattern may be disposed in a set shape at a set position, and it is possible to prevent a hot spot phenomenon from occurring by the light blocking layer. Accordingly, the lighting device and the lamp according to the embodiment may provide a linear light source or a surface light source having uniform luminance of emitted light.

BEST MODE

Hereinafter, preferred embodiments of the invention will be described in detail with reference to the accompanying drawings.

The technical idea of the invention is not limited to some of the described embodiments, but can be implemented in various different forms, and if it is within the scope of the technical idea of the invention, one or more of its components may be selectively combined and substituted between embodiments. In addition, terms (including technical and scientific terms) used in the embodiments of the invention, unless explicitly specifically defined and described, may be interpreted as a meaning that may be generally understood by those skilled in the art to which the invention belongs, and terms generally used, such as terms defined in the dictionary, may be interpreted in consideration of the context of the related technology. Also, terms used in the embodiments of the invention are for describing the embodiments and are not intended to limit the invention. In the present specification, the singular form may include a plural form unless specifically described in the phrase, and may include at least one of all combinations that may be combined as A, B, and C when described as "A and/or at least one (or more than one) of B and C". Also, terms such as first, second, A, B, (a), and (b) may be used to describe components of an embodiment of the invention. These terms are intended only to distinguish the components from other components and are not determined by their nature, sequence, or order. Also, when a component is described as being 'connected', 'coupled' or 'connected' to another component, not only when the component is directly connected, coupled or connected to another component, it may also be 'connected', 'coupled', or 'connected' due to another component between that component and the other component. In addition, when each component is described as being formed or disposed "up (above) or down (under)", the up (above) or down (under) includes not only when two components are in direct contact with each other, but also when one or more components are formed or disposed between two components. Also, when expressed as "up (above) or down (under)", it may include the meaning of not only the upward direction but also the downward direction based on one component.

Figure 1:
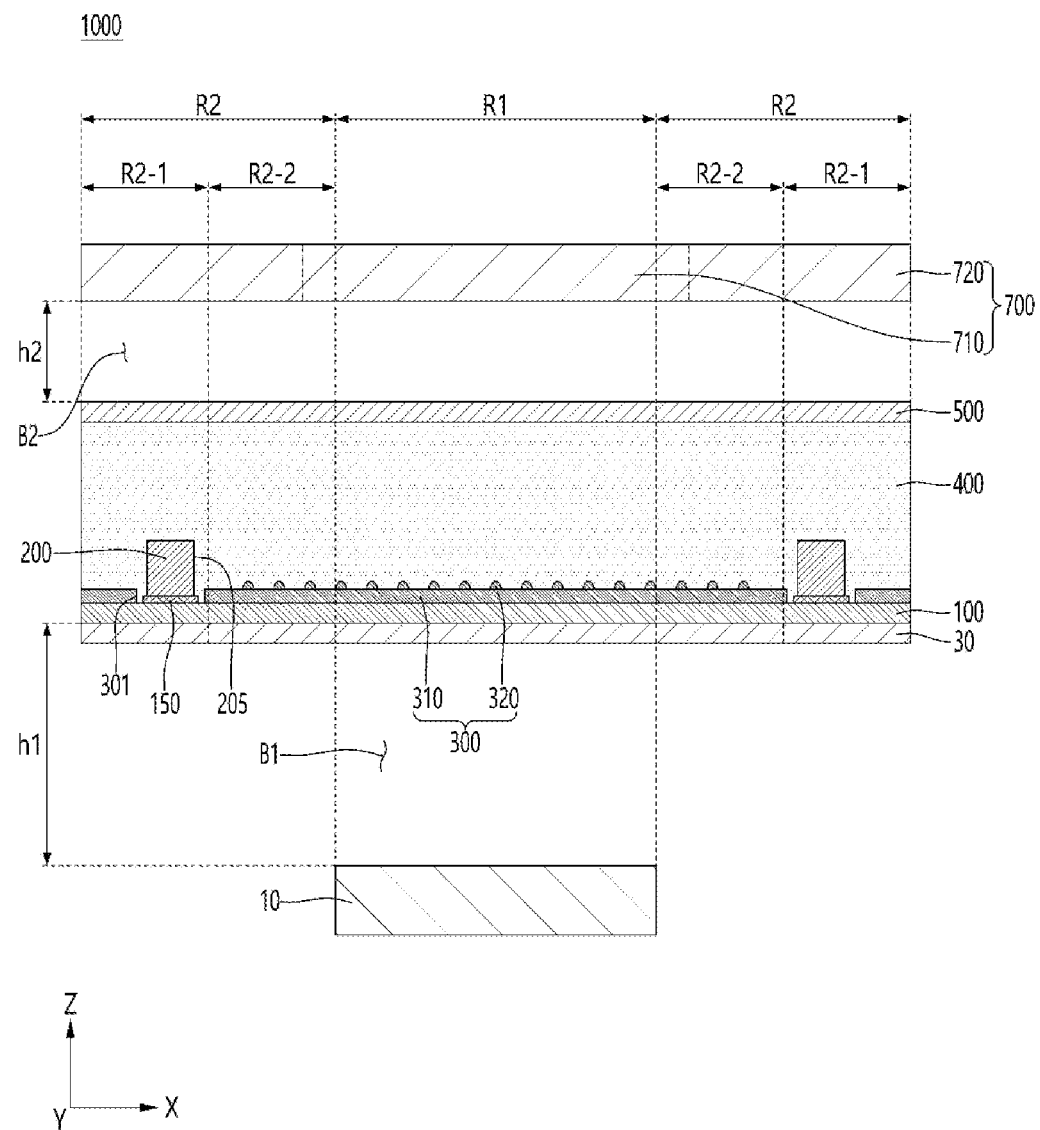
FIG. 1 is a cross-sectional view of a lighting device according to the embodiment.
Figure 2:
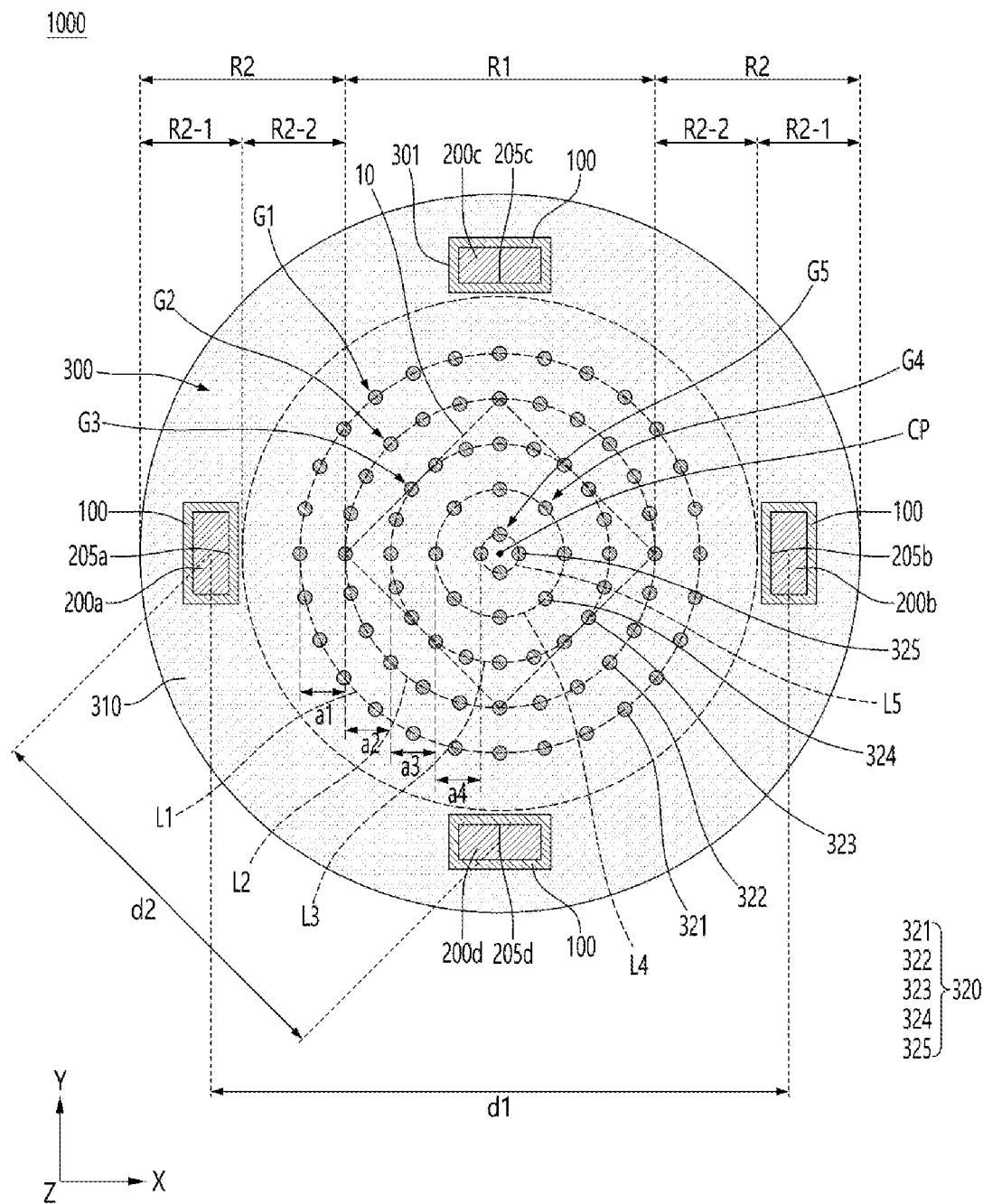
FIG. 2 is a plan view of a light source module of a lighting device according to the embodiment.

The lighting device according to the invention may be applied to various lamp devices that require lighting, such as vehicle lamps, household optical assemblies, and industrial optical assemblies. For example, when applied to a vehicle lamp, it may be applied to head lamp, side mirror lights, side maker lights, fog lights, tail lights, brake lights, daytime running lights, vehicle interior lights, door scars, rear combination lamps, backup lamps, etc. In addition, when applied to a vehicle lamp, it is applicable to a rear side assistance system (BSD) disposed in a side mirror or a-pillar, etc. Also, the optical assembly of the invention may be applied to indoor and outdoor advertising devices, display devices, and various electric vehicle fields, and in addition to all lighting-related fields or advertising-related fields that are currently developed and commercialized or may be implemented according to technological development in the future, etc. would be applicable. Before describing an embodiment of the invention, the first direction may refer to an x-axis direction illustrated in the drawing, a second direction may refer to a y-axis direction illustrated in the drawing, and a third direction may refer to a z-axis direction illustrated in the drawing. Also, the horizontal direction may mean first and second directions, and the vertical direction may mean a third direction perpendicular to at least one of the first and second directions. For example, the horizontal direction may refer to the x-axis and y-axis directions of the drawing, and the vertical direction may refer to the z-axis direction of the drawing, perpendicular to the x-axis and y-axis directions FIG. 1 is a cross-sectional view of a lighting device according to an embodiment, and FIG. 2 is a plan view of a light source module of the lighting device according to an embodiment. Also, FIG. 3 is a cross-sectional view for explaining an arrangement relationship of unit reflective patterns in a light source module according to an exemplary embodiment.

Figure 3:
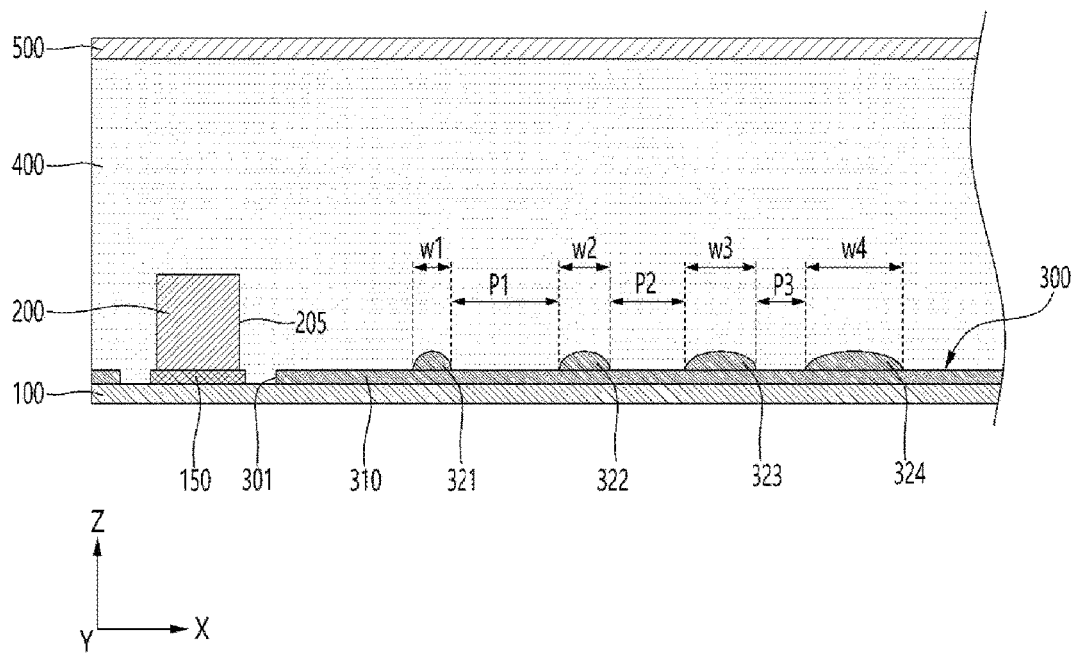
FIG. 3 is a cross-sectional view for explaining the arrangement relationship of unit reflective patterns in a light source module according to the embodiment.

Referring to FIGS. 1 to 3. a lighting device 1000 according to an embodiment may include a sensor 10 and a light source module. The sensor 10 may detect an object. For example, the sensor 10 may include a radar or lidar. The sensor 10 may emit a signal of a set angle and intensity toward a front of the sensor 10. Also, the sensor 10 may receive the emitted signal. That is, the sensor 10 may be a detection sensor capable of acquiring information about the front of the sensor 10 based on the detected signal. The sensor 10 may be provided as at least one sensor in the lighting device 1000 or may be provided as at least one module including the sensor 10. The light source module may be disposed on the sensor 10. In detail, the light source module may be disposed in a region overlapping the sensor 10 in a first direction perpendicular to an upper surface of the substrate 100. The light source module may be disposed on a path along which a signal emitted from the sensor 10 moves.

The light source module may be spaced apart from the sensor 10. For example, the light source module may be spaced apart from the sensor 10 in the first direction (vertical direction; z-axis direction). A first gap B1 may be formed between the two components due to the separation of the sensor 10 and the light source module. The first gap B1 may be air or vacuum. The light source module may be spaced apart from the sensor 10 at a first height h1. Here, the first height h1 may be a distance between an upper surface of the sensor 10 facing the light source module and a lower surface of the substrate 100 of the light source module. The first height h1 may be about 60 mm or more. In detail, the first height h1 may be about 80 mm or more. When the first height h1 is less than about 60 mm, the signal emitted from the sensor 10 may interfere with the light source module while being provided to the outside. That is, the height of the first gap B1 formed between the sensor 10 and the light source module is so small that the light source module may interfere with the signal of the sensor 10, which may significantly reduce the reliability of the sensor 10. Preferably, the first height h1 may be greater than or equal to about 100 mm in order to prevent signals from the sensor 10 from being interfered with and to effectively emit light from the light source module.

The light source module may include a substrate 100, a light source 200, a reflective layer 300 and a resin layer 400. The light source module may emit light emitted from the light source 200 as a linear light source or a surface light source. The substrate 100 may include a material through which signals emitted from the sensor 10 may pass. In detail, the substrate 100 may include a material through which electromagnetic waves emitted from the sensor 10 may pass, and which may prevent or minimize attenuation or distortion of the electromagnetic waves. For example, the substrate 100 may include at least one of PET (Polyethylene terephthalate), PS (Polystyrene), PI (Polyimide), PEN (Polyethylene naphthalate), PC (Poly carbonate), PMI (Polymethacrylimide), PP (Polypropylene), PVC (Polydimethylsiloxane), and PTFE (Polytetrafluoroethylene).

The substrate 100 may have a thickness of about 30 μm to about 300 μm. When the substrate 100 has a thickness of less than about 30 μm, it may be difficult to effectively support a component disposed on the substrate 100, for example, the light source 200, and a problem may occur in that a region of the substrate 100 on which the light source 200 is disposed may be stretched by the weight of the light source 200. Accordingly, the reliability of the substrate 100 may deteriorate, and an alignment problem of the light source 200 disposed on the substrate 100 may occur. Also, when the thickness of the substrate 100 exceeds about 300 μm, the total thickness of the lighting device 1000 may increase and flexibility of the substrate 100 may decrease. The substrate 100 may have various shapes. For example, the substrate 100 may have various shapes such as a polygonal shape, a circular shape, and an elliptical shape. The substrate 100 may have a shape corresponding to that of the lighting device 1000. In addition, the substrate 100 may have a shape corresponding to an optical member 700 to be described later.

The substrate 100 may include a plurality of regions. For example, the substrate 100 may include a first region R1 and a second region R2. The first region R1 may be a region including a center CP of the substrate 100. The first region R1 may be a center region of the substrate 100. The sensor 10 may overlap the first region R1 of the substrate 100 in the first direction (vertical direction; z-axis direction). The second region R2 may be a region disposed around the first region R1. The second region R2 may be an edge region of the substrate 100. The second region R2 is a region of the substrate 100 excluding the first region R1 and may be a region surrounding the first region R1. The second region R2 may be a region that does not overlap with the sensor 10 in the first direction. The second region R2 may include a plurality of sub regions. For example, the second region R2 may include a 2-1 region R2-1 and a 2-2 region R2-2 as sub-regions. The 2-1 region R2-1 may be an edge region of the substrate 100. The 2-1 region R2-1 may be an outermost region of the second region R2. The 2-1 region R2-1 may be a region where the light source 200 is disposed. The 2-2 region R2-2 may be a region disposed between the first region R1 and the 2-1 region R2-1. The 2-2 region R2-2 may be a region closer to the center CP of the substrate 100 than the 2-1 region R2-1. The 2-2 region R2-2 may be disposed surrounding the first region R1, and the 2-1 region R2-1 may be disposed surrounding the 2-2 region R2-2.

The substrate 100 may include an electrode pattern 150. The electrode pattern 150 may be disposed on the upper surface of the substrate 100. In detail, the electrode pattern 150 may be disposed on the upper surface of the substrate 100 facing the resin layer 400.

The electrode pattern 150 may include a conductive material. For example, the electrode pattern 150 may include at least one of aluminum (Al), copper (Cu), silver (Ag), gold (Au), chromium (Cr), nickel (Ni), molybdenum (Mo), titanium (Ti), and alloys thereof, carbon, and a conductive polymer. The electrode pattern 150 may include at least one of transparent conductive materials, for example, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), and (GZO) gallium zinc oxide. The electrode pattern 150 may be disposed on the second region R2 of the substrate 100. In detail, the electrode pattern 150 may be provided in a region overlapping the second region R2 of the substrate 100 in the first direction to provide power to the light source 200 disposed on the second region R2. Also, the electrode pattern 150 may not overlap the first region R1 of the substrate 100 in the first direction. That is, the electrode pattern 150 may be disposed only on the second region R2 and may not overlap the sensor 10 in the first direction.

The light source 200 may be disposed on the substrate 100. The light source 200 may be disposed on the upper surface of the substrate 100. The light source 200 may be disposed on the second region R2 of the substrate 100. In detail, the light source 200 may be disposed on the 2-1 region R2-1 of the substrate 100. The light source 200 may be disposed on the electrode pattern 150 disposed on the second region R2 and electrically connected to the electrode pattern 150. The light source 200 may not overlap the first region R1 in the first direction. That is, the light source 200 may not be disposed on the first region R1 and may not overlap the sensor 10 in the first direction.

The light source 200 may include a plurality of light emitting devices. The light emitting device is a device having a light emitting diode (LED) and may include a package in which a light emitting chip is packaged. The light emitting chip may emit at least one of blue, red, green, ultraviolet (UV), and infrared light, and the light emitting device may emit at least one of blue, red, green, and infrared light. The light emitting device may be a side view type in which a bottom portion is connected to the electrode pattern 150. That is, the light emitting device 205 may face a side portion of the lighting device 1000. Also, an optical axis of the light emitting device may be parallel to the upper surface of the substrate 100. The plurality of light emitting devices may be disposed along an edge of the substrate 100. For example, the plurality of light emitting devices may be arranged on a virtual line forming a polygon, circle, or ellipse having the center CP of the substrate 100 as a center point. The plurality of light emitting devices may be spaced apart from each other on the virtual line. The plurality of light emitting devices may be disposed at regular interval, for example, an equal interval according to the shape of the virtual line. In addition, some of the plurality of light emitting devices may be disposed at a first equal interval with adjacent light emitting devices, and the remaining light emitting devices may be disposed at a second equal interval different from the first equal interval with the adjacent light emitting devices.

2n (where n is a natural number) number of the plurality of light emitting devices may be disposed on the substrate 100. In this case, the plurality of light emitting devices may be arranged to correspond to each other based on the center CP of the substrate 100. For example, when two light emitting devices are provided and include a first light emitting device 200a and a second light emitting device 200b, the first light emitting device 200a and the second light emitting device 200b may be disposed to correspond to each other based on the center CP of the substrate 100. In detail, the light emitting surfaces 205a and 205b of the first light emitting device 200a and the second light emitting device 200b may face each other. In more detail, an optical axis of the first light emitting device 200a and an optical axis of the second light emitting device 200b may be arranged on the same line and may overlap with the center CP of the substrate 100.

In this case, the light source 200 may include at least one light emitting group. The light emitting group may be defined as a pair (two) of light emitting devices disposed to correspond to each other among the plurality of light emitting devices. In detail, the first light emitting device 200a and the second light emitting device 200b on which the light emitting surfaces 205a and 205b face each other may be defined as one light emitting group. The one light emitting group may emit light toward the first region R1. In detail, the light emitting group may emit light toward the center CP of the substrate 100. As another example, the four light emitting devices are provided as shown in FIG. 2, and may include a first light emitting device 200a, a second light emitting device 200b, a third light emitting device 200c, and a fourth light emitting device 200d. In this case, the first light emitting device 200a and the second light emitting device 200b may be arranged to correspond to each other based on the center CP of the substrate 100. Also, the third light emitting device 200c and the fourth light emitting device 200d may be arranged to correspond to each other based on the center CP of the substrate 100. Specifically, the first light emitting device 200a and the second light emitting device 200b may be disposed such that light emitting surfaces 205a and 205b face each other, and the third light emitting device 200c and the fourth light emitting device 200d may be disposed such that light emitting surfaces 205c and 205d face each other. In more detail, the optical axis of the first light emitting device 200a and the optical axis of the second light emitting device 200b may be disposed on the same line and may overlap with the center CP of the substrate 100. Also, an optical axis of the third light emitting device 200c and an optical axis of the fourth light emitting device 200d may be arranged on the same line and may overlap with the center of the substrate 100. At this time, the virtual line connecting the centers of the first light emitting device 2a and the second light emitting device 200b may be orthogonal to the virtual line connecting the centers of the third light emitting device 200c and the fourth light emitting device 200d. Accordingly, the first to fourth light emitting devices 200a, 200b, 200c, and 200d may emit light toward the center CP of the substrate 100. Accordingly, the first to fourth light emitting devices 200a, 200b, 200c, and 200d may emit light toward the center CP of the substrate 100.

The light source 200 may include at least one light emitting group. In detail, the light source 200 may include a plurality of light emitting groups. For example, the first light emitting device 200a and the second light emitting device 200b disposed with the light emitting surfaces 205a and 205b facing each other may be defined as a first light emitting group, and the third light emitting device 200c and the fourth light emitting device 200d may be defined as a second light emitting group. Each of the first and second light emitting groups may emit light toward the first region R1. In detail, the light emitting group may emit light toward the center CP of the substrate 100. A pair of light emitting devices included in each of the plurality of light emitting groups may be spaced apart in a second direction (horizontal direction). For example, the first light emitting device 200a and the second light emitting device 200b included in the first light emitting group may be spaced apart in a second direction (horizontal direction), and the third light emitting device 200c and the fourth light emitting device 200d included in the second light emitting group may be spaced apart in a second direction (horizontal direction). At this time, the distance between a pair of light emitting devices included in one light emitting group (first or second light emitting group) may be greater than the distance between one light emitting device included in the one light emitting group and one light emitting device included in the other light emitting group. For example, the first and second light emitting devices 200a and 200b of the first light emitting group may be spaced apart by a first separation distance dl in the second direction (horizontal direction), and the first light emitting device 200a and the third light emitting device 200c or the fourth light emitting device 200d of the second light emitting group may be spaced apart by a second separation distance dl in the second direction (horizontal direction). That is, when the light source 200 includes a plurality of light emitting groups, they may be spaced apart while satisfying the above characteristics in consideration of the light reflection characteristics of the reflective layer 300 and the emitted luminance uniformity characteristics.

The reflective layer 300 may be disposed on the substrate 100. The reflective layer 300 may be disposed between the substrate 100 and the resin layer 400. The reflective layer 300 may be provided in the form of a film and adhered to the upper surface of the substrate 100. In addition, the reflective layer 300 may be attached between the substrate 100 and the resin layer 400, but is not limited thereto. The reflective layer 300 may have an area smaller than that of the upper surface of the substrate 100. For example, the reflective layer 300 may be spaced apart from the edge of the substrate 100, and the resin layer 400 may be attached to the substrate 100 in the spaced region. Accordingly, peeling of the edge portion of the reflective layer 300 may be prevented. The reflective layer 300 may include an opening 301 in which a lower portion of the light emitting device is disposed. An upper surface of the substrate 100 may be exposed through the opening 301 of the reflective layer 300. Part or all of the electrode pattern 150 to which the lower portion of the light emitting device is bonded may be exposed through the opening 301 of the reflective layer 300. The size of the opening 301 may be equal to or larger than the size of the light emitting device.

The reflective layer 300 may be provided with a thickness smaller than that of the light emitting device. The reflective layer 300 may be formed to a thickness smaller than that of the light emitting device. The thickness of the reflective layer 300 may include a range of 0.2 mm 0.02 mm. The lower portion of the light emitting device 200 may be partially inserted through the opening 301 of the reflective layer 300, and the remaining region of the light emitting device 200, for example, the upper portion may protrude from the upper surface of the reflective layer 300. The light emitting surface 205 of the light emitting device 200 may be parallel to the upper surface of the reflective layer 300.

The reflective layer 300 may include a metallic material or a non-metallic material. The metallic material may include a metal such as aluminum, silver, or gold. The non-metallic material may include a plastic material or a resin material. The plastic material may be any one selected from the group consisting of polyethylene, polypropylene, polystyrene, polyvinyl chloride, polychloride biphenyl, polyethylene terephthalate, polyvinyl alcohol, polycarbonate, polybutylene terephthalate, polyethylene naphthalate, polyamide, polyacetal, polyphenylene ether, polyamide, polyetherimide, polyether ether ketone, polyimide, polytetrafluoroethylene, a liquid crystal polymer, a fluorine resin, and a mixture thereof. As the resin material, a reflective material such as $TiO_2$, $Al_2O_3$, or $SiO_2$ may be added to silicon or epoxy. The reflective layer 300 may be implemented as a single layer or multiple layers, and light reflective efficiency may be improved by such a layer structure. The reflective layer 300 may increase the amount of light by reflecting the incident light so that the light is uniformly distributed. Here, the reflective layer 300 may be omitted when a highly reflective material is coated on the upper surface of the substrate 100.

The reflective layer 300 may include a plurality of reflective agents (not shown). The reflective agents may be a bubble such as air or a medium having the same refractive index as air. The reflective layer 300 may reflect or refract light incident by the plurality of reflective agents in different directions.

The reflective layer 300 may include an optical sheet 310 and a plurality of unit reflective patterns 320. The optical sheet 310 may be disposed on an upper surface of the substrate 100. The optical sheet 310 may include a material having excellent light reflection characteristics, for example, the above-described metal or non-metal material. The plurality of unit reflective patterns 320 may be disposed on the optical sheet 310. In detail, the plurality of unit reflective patterns 320 may be disposed on an upper surface of the optical sheet 310 facing the resin layer 400.

The plurality of unit reflective patterns 320 may have a dot shape. The plurality of unit reflective patterns 320 may be disposed in a form protruding from the upper surface of the optical sheet 310. The planar shape of each of the plurality of unit reflective patterns 320 may include one selected from a circular shape, an elliptical shape, and a polygonal shape. The plurality of unit reflective patterns 320 may include reflective ink. For example, the plurality of unit reflective patterns 320 may be formed on the optical sheet 310 through printing. The plurality of unit reflective patterns 320 may be formed by printing with a material including any one of $TiO_2$, $CaCO_3$, $BaSO_4$, $Al_2O_3$, Silicon, and PS. The plurality of unit reflective patterns 320 may be disposed on a movement path of light emitted from the light emitting device and/or a movement path of light emitted from the light emitting device and reflected to other components. Accordingly, the reflective layer 300 may reduce light loss by improving light reflectance, and may have improved luminance when implementing a linear light source or a surface light source.

The reflective layer 300 includes a plurality of reflective pattern groups including the plurality of unit reflective patterns 320, and each of the plurality of reflective pattern groups may be disposed at a set position. The plurality of reflective pattern groups may be disposed on the first region R1 of the substrate 100. In detail, the reflective pattern group may be disposed in a region overlapping the first region R1 of the substrate 100 in a first direction (vertical direction; z-axis direction). Some of the plurality of unit reflective patterns 320 may be disposed on the first region R1. A portion of the plurality of unit reflective patterns 320 may overlap the sensor 10 in a first direction. A part of the reflective pattern group may be disposed on the second region R2 of the substrate 100. In detail, a part of the reflective pattern group may be disposed on a 2-2 region R2-2 of the substrate 100. The rest of the plurality of unit reflective patterns 320 may be disposed on the 2-2 region R2-2.

Part of the plurality of unit reflective patterns 320 may be disposed between the first light emitting device 200a and the second light emitting device 200b, and may be disposed to overlap the two lights emitting devices 200a and 200b in a second direction (horizontal direction). In addition, other parts of the plurality of unit reflective patterns 320 may be disposed between the third light emitting device 200c and the fourth light emitting device 200d, and may overlap the two lights emitting devices 200c and 200d in the second direction (horizontal direction). That is, the plurality of unit reflective patterns 320 may be disposed on a light emitting path of the plurality of light emitting devices.

The reflective pattern group may not be disposed on a 2-1 region R2-1 of the substrate 100. That is, the unit reflective pattern 320 may not overlap the 2-1 region R2-1 on which the light emitting device is disposed in the first direction, and may be spaced apart from the light emitting device in the second direction (horizontal direction). The plurality of reflective pattern groups is provided in n number (where n is a natural number equal to or greater than 3), and each of the plurality of reflective pattern groups may include a plurality of unit reflective patterns 320. For example, the plurality of reflective pattern groups may include a first reflective pattern group G1, a second reflective pattern group G2, and a third reflective pattern group G3. The first reflective pattern group G1 may be closest to the light emitting device among the plurality of reflective pattern groups. The first reflective pattern group G1 may include a plurality of unit reflective patterns 320 disposed along a virtual first line L1 forming a polygon, circle, or ellipse. Here, the center of the figure formed by the first line L1 may overlap the center CP of the substrate 100.

The unit reflective pattern included in the first reflective pattern group G1 may be named a first reflective pattern 321. The plurality of first reflective patterns 321 may have a first width w1. In addition, the plurality of first reflective patterns 321 adjacent to each other on the first line L1 may be spaced apart at a first pitch interval. For example, when a shape formed by the first line L1 is a circle or an equilateral n-angle (where n is a natural number of 3 or more), the first pitch interval between the plurality of first reflective patterns 321 adjacent to each other may be the same. In addition, when the shape formed by the first line L1 is an ellipse or has a shape in which curved lines and straight lines are mixed, the first pitch interval may be partially the same or different from each other. The second reflective pattern group G2 may be located farther from the light emitting device than the first reflective pattern group G1. The second reflective pattern group G2 may include a plurality of unit reflective patterns 320 disposed along a virtual second line L2 forming a polygon, circle, or ellipse. Here, the center of the shape formed by the second line L2 may overlap the center of the substrate 100. Also, the unit reflective pattern included in the second reflective pattern group G2 may be referred to as a second reflective pattern 322.

The second line L2 may have the same or different shape as the first line L1. For example, the second line L2 may have the same shape as the first line L1 in consideration of light reflection characteristics. The second line L2 may be spaced apart from the first line L1. The second line L2 may be spaced apart from the first line L1 by a first distance a1. The second line L2 may be disposed inside the first line L1. The second line L2 may be closer to the center of the substrate 100 than the first line L1.

The second reflective pattern 322 may be spaced apart from the first reflective pattern 321. For example, the second reflective pattern 322 may be spaced apart from the first reflective pattern 321 by a first interval P1 in a second direction. In addition, the shortest interval in the second direction between the second reflective pattern 322 and the center CP of the substrate 100 may be shorter than the shortest interval in the second direction between the first reflective pattern 321 and the center CP of the substrate 100. The plurality of second reflective patterns 322 may have a second width w2. The second width w2 may be greater than the first width w1. That is, the size (planar area) of the second reflective pattern 322 may be greater than the size (planar area) of the first reflective pattern 321. The plurality of second reflective patterns 322 adjacent to each other on the second line L2 may be spaced apart at a second pitch interval smaller than the first pitch interval. For example, when the shape formed by the second line L2 is a circle or an equilateral n-angle (where n is a natural number of 3 or more), the second pitch interval between the plurality of adjacent second reflective patterns 322 may be the same. Also, when the shape formed by the second line L2 is an ellipse or has a mixed shape of curved lines and straight lines, the second pitch intervals may be partially the same or different from each other.

The second reflective pattern group G2 may include a set number of second reflective patterns 322. For example, the number of the second reflective patterns 322 disposed on the second line L2 may be less than or equal to the number of the first reflective patterns 321 of the first reflective pattern group G1. Preferably, the number of second reflective patterns 322 may be less than the number of first reflective patterns 321. The plurality of second reflective patterns 322 included in the second reflective pattern group G2 may have a set density per unit area. In detail, the density of the plurality of second reflective patterns 322 may be higher than the density of the plurality of first reflective patterns 321 included in the first reflective pattern group G1.

The third reflective pattern group G3 may be located farther from the light emitting device than the second reflective pattern group G2. The third reflective pattern group G3 may include a plurality of unit reflective patterns 320 disposed along a virtual third line L3 forming a polygon, circle, or ellipse. Here, the center of the figure formed by the third line L3 may overlap the center of the substrate 100. Also, the unit reflective pattern included in the third reflective pattern group G3 may be named a third reflective pattern 323.

The third line L3 may have the same or different shape as the second line L2. For example, the third line L3 may have the same shape as the second line L2 in consideration of light reflection characteristics. The third line L3 may be spaced apart from the second line L2. The third line L3 may be separated from the second line L2 by a second distance a2 smaller than the first distance a1. The third line L3 may be disposed inside the second line L2. The third line L3 may be closer to the center of the substrate 100 than the second line L2. The third reflective pattern 323 may be spaced apart from the second reflective pattern 322. For example, the third reflective pattern 323 may be spaced apart from the second reflective pattern 322 by a second interval P2 in a second direction. The second interval P2 may be smaller than the first interval P1. In addition, the shortest interval in the second direction between the third reflective pattern 323 and the center CP of the substrate 100 may be shorter than the shortest interval in the second direction between the second reflective pattern 322 and the center CP of the substrate 100.

The plurality of third reflective patterns 323 may have a third width w3. The third width w3 may be greater than the second width w2. That is, the size (planar area) of the third reflective pattern 323 may be greater than the size (planar area) of the second reflective pattern 322. The plurality of third reflective patterns 323 adjacent to each other on the third line L3 may be spaced apart at a third pitch interval smaller than the second pitch interval. For example, when the figure formed by the third line L3 is a circle or an equilateral n-angle (where n is a natural number of 3 or more), the third pitch interval between the plurality of adjacent third reflective patterns 323 may be the same. Also, when the figure formed by the third line L3 is an ellipse or has a mixed shape of curved lines and straight lines, the third pitch intervals may be partially the same or different from each other.

The plurality of third reflective patterns 323 included in the third reflective pattern group G3 may have a set density per unit area. In detail, the density of the plurality of third reflective patterns 323 may be higher than the density of the plurality of second reflective patterns 322 included in the second reflective pattern group G2. The third reflective pattern group G3 may include a set number of third reflective patterns 323. For example, the number of the third reflective patterns 323 disposed on the third line L3 may be less than or equal to the number of the second reflective patterns 322 of the second reflective pattern group G2. Preferably, the number of the third reflective patterns 323 may be less than the number of the second reflective patterns 322.

The plurality of reflective pattern groups may further include a fourth reflective pattern group G4 and a fifth reflective pattern group G5 as shown in FIG. 2. The fourth reflective pattern group G4 may be located farther from the light emitting device than the third reflective pattern group G3. The fourth reflective pattern group G4 may include a plurality of unit reflective patterns 320 disposed along a virtual fourth line L4 forming a polygon, circle, or ellipse. Here, the center of the figure formed by the fourth line L4 may overlap the center of the substrate 100. Also, the unit reflective pattern included in the fourth reflective pattern group G4 may be named a fourth reflective pattern 324. The fourth line L4 may have the same or different shape as the third line L3. For example, the fourth line L4 may have the same shape as the third line L3 in consideration of light reflection characteristics. The fourth line L4 may be spaced apart from the third line L3. The fourth line L4 may be separated from the third line L3 by a third distance a3 smaller than the second distance a2. The fourth line L4 may be disposed inside the third line L3. The fourth line L4 may be closer to the center of the substrate 100 than the third line L3. The fourth reflective pattern 324 may be spaced apart from the third reflective pattern 323. For example, the fourth reflective pattern 324 may be spaced apart from the third reflective pattern 323 by a third distance P3 in the second direction. The third interval P3 may be smaller than the second interval P2 In addition, the shortest interval in the second direction between the fourth reflective pattern 324 and the center CP of the substrate 100 may be shorter than the shortest interval in the second direction between the third reflective pattern 323 and the center CP of the substrate 100. The plurality of fourth reflective patterns 324 may have a fourth width w4. The plurality of fourth reflective patterns 324 may have a fourth width w4. The fourth width w4 may be greater than the third width w3. That is, the size (planar area) of the fourth reflective pattern 324 may be greater than the size (planar area) of the third reflective pattern 323. The plurality of fourth reflective patterns 324 adjacent to each other on the fourth line L4 may be spaced apart at a fourth pitch interval smaller than the third pitch interval. For example, when the shape formed by the fourth line L4 is a circle or an equilateral n-angle (where n is a natural number of 3 or more), the fourth pitch interval between the plurality of fourth reflective patterns 324 adjacent to each other may be the same. Also, when the shape formed by the fourth line L4 has an elliptical shape or a mixed shape of curved lines and straight lines, the fourth pitch intervals may be partially the same or different from each other.

The plurality of fourth reflective patterns 324 included in the fourth reflective pattern group G4 may have a set density per unit area. In detail, the density of the plurality of fourth reflective patterns 324 may be higher than the density of the plurality of third reflective patterns 323 included in the third reflective pattern group G3. The fourth reflective pattern group G4 may include a set number of fourth reflective patterns 324. For example, the number of the fourth reflective patterns 324 disposed on the fourth line L4 may be less than or equal to the number of the third reflective patterns 323 of the third reflective pattern group G3. Preferably, the number of the fourth reflective patterns 324 may be less than the number of the third reflective patterns 323.

The fifth reflective pattern group G5 may be located farther from the light emitting device than the fourth reflective pattern group G4. The fifth reflective pattern group G5 may include a plurality of unit reflective patterns 320 disposed along a virtual fifth line L5 forming a polygon, circle, or ellipse. Here, the center of the figure formed by the fifth line L5 may overlap the center of the substrate 100. Also, the unit reflective pattern included in the fifth reflective pattern group G5 may be named a fifth reflective pattern 325. The fifth line L5 may have the same or different shape as the fourth line L4. For example, the fifth line L5 may have the same shape as the fourth line L4 in consideration of light reflection characteristics. The fifth line L5 may be spaced apart from the fourth line L4. The fifth line L5 may be separated from the fourth line L4 by a fourth distance a4 smaller than the third distance a3. The fifth line L5 may be disposed inside the fourth line L4. The fifth line L5 may be closer to the center of the substrate 100 than the fourth line L4. The fifth reflective pattern 325 may be spaced apart from the fourth reflective pattern 324. For example, the fifth reflective pattern 325 may be spaced apart from the fourth reflective pattern 324 by a fourth interval in a second direction. The fourth interval may be smaller than the third interval P3. In addition, the shortest interval in the second direction between the fifth reflective pattern 325 and the center CP of the substrate 100 may be shorter than the shortest interval in the second direction between the fourth reflective pattern 324 and the center CP of the substrate 100.

The plurality of fifth reflective patterns 325 may have a fifth width. The fifth width may be greater than the fourth width w4. That is, the size (planar area) of the fifth reflective pattern 325 may be greater than the size (planar area) of the fourth reflective pattern 324. The plurality of fifth reflective patterns 325 adjacent to each other on the fifth line L5 may be spaced apart at a fifth pitch interval smaller than the fourth pitch interval. For example, when the shape formed by the fifth line L5 is a circle or an equilateral n-angle (where n is a natural number of 3 or more), the fifth pitch interval between the plurality of adjacent fifth reflective patterns 325 may be the same. Further, when the shape formed by the fifth line L5 is an ellipse or has a mixed shape of curved lines and straight lines, the fifth pitch intervals may be partially the same or different from each other.

The plurality of fifth reflective patterns 325 included in the fifth reflective pattern group G5 may have a set density per unit area. In detail, the density of the plurality of fifth reflective patterns 325 may be higher than the density of the plurality of fourth reflective patterns 324 included in the fourth reflective pattern group G4. The fifth reflective pattern group G5 may include a set number of fifth reflective patterns 325. For example, the number of the fifth reflective pattern 325 disposed on the fifth line L5 may be less than or equal to the number of the fourth reflective pattern 324 of the fourth reflective pattern group G4. Preferably, the number of the fifth reflective patterns 325 may be less than the number of the fourth reflective patterns 324.

The reflective layer 300 according to an embodiment may include a plurality of reflective pattern groups including a plurality of unit reflective patterns 320, and the plurality of unit reflective patterns 320 may be disposed on the first region R1 and the 2-2 region R2-2 to improve light reflective characteristics. In particular, the maximum interval between the plurality of unit reflective patterns 320 disposed on the first region R1 may be smaller than the maximum interval between the plurality of unit reflective patterns 320 disposed on the 2-2 region R2-2. For example, the reflective pattern group closest to the light emitting device, for example, the first reflective pattern group G1, may be disposed on the 2-2 region R2-2, and the reflective pattern group closest to the center CP of the substrate 100, for example, the fifth reflective pattern group G5, may be disposed on the first region R1. In this case, the maximum interval (the fifth pitch interval) between the fifth reflective patterns 325 adjacent to each other in the fifth reflective pattern group G5 may be smaller than the maximum interval (the first pitch interval) between the first reflective patterns 321 adjacent to each other in the first reflective pattern group G1. The size of the plurality of unit reflective patterns 320 disposed on the first region R1 may be greater than the size of the plurality of unit reflective patterns 320 disposed on the 2-2 region R2-2. For example, the size of the fifth reflective pattern 325 of the fifth reflective pattern group G5 may be greater than that of the first reflective pattern 321 of the first reflective pattern group G1.

That is, in the embodiment, the interval between the plurality of the reflective pattern groups, for example, the unit reflective patterns 320 included in each reflective pattern group, may decrease toward the first region R1 in the 2-2 region R2-2 and toward the center CP of the substrate 100. In addition, the size of the unit reflective pattern 320 may increase and the density of the unit reflective pattern 320 may also increase as the 2-2 region R2-2 moves toward the center CP of the substrate 100. Accordingly, the reflective layer 300 may effectively reflect the light emitted from the light source 200 to provide uniform light.

The resin layer 400 may be disposed on the substrate 100. The resin layer 400 may face the substrate 100. The resin layer 400 may be disposed on the entire upper surface or a partial region of the substrate 100. A lower surface area of the resin layer 400 may be equal to or greater than an upper surface area of the substrate 100. A portion of the resin layer 400 may overlap the sensor 10 in the first direction (vertical direction; z-axis direction). The resin layer 400 may be formed of a transparent material. The resin layer 400 may include a resin material such as silicone or epoxy. The resin layer 400 may include a thermosetting resin material, for example, PC, OPS, PMMA, PVC, or the like may be selectively included. The resin layer 400 may be formed of glass, but is not limited thereto. For example, a resin material containing urethane acrylate oligomer as a main material may be used as the main material of the resin layer 400. For example, a mixture of a synthetic oligomer, urethane acrylate oligomer, and a polyacrylic polymer type may be used. Of course, a monomer in which IBOA (isobornyl acrylate), HPA (Hydroxylpropyl acrylate, 2-HEA (2-hydroxyethyl acrylate) and the like, which are low-boiling dilute reactive monomers, may be further included, and a photoinitiator (e.g., 1-hydroxycyclohexyl phenyl-ketone) or an antioxidant may be mixed as an additive.

Since the resin layer 400 is provided as a layer for guiding light with resin, it may be provided with a thinner thickness than that of glass and may be provided as a flexible plate. The resin layer 400 may emit a point light source emitted from the light emitting device 200 in the form of a line light source or a surface light source. The upper surface of the resin layer 400 may emit light by diffusing light emitted from the light emitting device 200. For example, a bead (not shown) may be included in the resin layer 400, and the bead diffuses and reflects incident light to increase the amount of light. The beads may be disposed in a range of 0.01 to 0.3% based on the weight of the resin layer 400. The bead may be formed of any one selected from silicon, silica, glass bubble, PMMA (Polymethyl methacrylate), urethane, Zn, Zr, Al2O3, and acryl, and the particle diameter of the bead may be in the range of about 1 μm to about 20 μm, but is not limited thereto. The light emitting device 200 may be buried to a lower portion of the resin layer 400. The resin layer 400 may contact the surface of the light emitting device 200 and may contact the light emitting surface 205 of the light emitting device 200. A portion of the resin layer 400 may be disposed in the opening 301 of the reflective layer 300. A portion of the resin layer 400 may contact the upper surface of the substrate 100 through the opening 301 of the reflective layer 300. Accordingly, as a part of the resin layer 400 comes into contact with the substrate 100. the reflective layer 300 may be fixed between the resin layer 400 and the substrate 100.

The resin layer 400 may be formed to a thickness greater than that of the light emitting device 200. For example, the resin layer 400 may have a thickness of about 1 mm or more. In detail, the resin layer 400 may have a thickness of about 1 mm to about 10 mm. When the thickness of the resin layer 400 is less than about 1 mm, light emitted from the light emitting device 200 may not be effectively guided. Accordingly, it may be difficult for the light source module 1000 to implement a uniform surface light source. In addition, when the thickness of the resin layer 400 is less than about 1 mm, it may be difficult to effectively protect the light emitting device 200, and adhesion between the substrate 100 and the reflective layer 300 may be reduced. In addition, when the thickness of the resin layer 400 exceeds about 10 mm, light loss may occur due to an increase in the movement path of light emitted from the light emitting device 200, and the luminance of the surface light source may decrease. Therefore, it is preferable that the thickness of the resin layer 400 satisfies the aforementioned range.

The light source module may further include a protective layer 500. The protective layer 500 may be disposed on the resin layer 400. The protective layer 500 may be positioned at the topmost of the light source module. The protective layer 500 may protect components disposed thereunder. The protective layer 500 may include a light-transmitting material. In addition, the protective layer 500 may include a material through which signals emitted from the sensor 10 may pass without being interfered with. The protective layer 500 may include at least one of PET (Polyethylene terephthalate), PS (Polystyrene), PI (Polyimide), PEN (Polyethylene naphthalate), PC (Poly carbonate). The protective layer 500 may have a thickness of about 50 μm to about 2 mm. In detail, the protective layer 500 may have a thickness of about 50 μm to about 1.5 mm. When the thickness of the protective layer 500 is less than about 50 μm, it may be difficult to effectively protect elements disposed thereunder due to the relatively thin thickness. In addition, when the thickness of the protective layer 500 exceeds about 2 mm, the total thickness of the light source module may increase and luminance may decrease. In addition, when the thickness of the protective layer 500 exceeds about 2 mm, flexibility of the light source module may be reduced due to the thickness. In this case, the structure and shape to which the light source module may be applied may be limited. Therefore, it is preferable that the thickness of the protective layer 500 satisfies the aforementioned range.

The light source module may further include a housing 30. The housing 30 may be disposed on a lower surface of the substrate 100 facing the sensor 10. That is, the housing 30 may be disposed between the substrate 100 and the sensor 10. The housing 30 may be adhered to the lower surface of the substrate 100. In this case, the first gap B1 may be disposed between the housing 30 and the sensor 10. The housing 30 may have a predetermined reliability and include a material through which signals emitted from the sensor 10 may pass. For example, the housing 30 may include at least one of PP (polypropylene), (PE) polyethylene, (PC) polycarbonate, PBT (Polybutylene Terephthalate), POM (Poly Oxy Methylene, Polyacetal), PPO (Polyphenylene Oxide), and modified PPO resin.

The housing 30 may be provided with a thickness of about 1 mm or more. In detail, the housing 30 may be provided with a thickness of about 1 mm to about 10 mm. Preferably, the housing 30 may be provided with a thickness of about 1 mm to about 5 mm in consideration of reliability and the overall thickness of the lighting device 1000. The housing 30 may support components disposed thereon on the lower surface of the substrate 100, such as the substrate 100, the reflective layer 300, and the resin layer 400. In addition, the housing 30 may form a sufficient space between the substrate 100 and the sensor 10. That is, the housing 30 may be provided within the above-described thickness range so that the first gap B1 may secure a set separation distance (first height h1) and may support the substrate 100 and the configuration disposed on the substrate 100.

The lighting device 1000 may include an optical member 700. The optical member 700 may be disposed on the light source module. The optical member 700 may be disposed on the protective layer 500. The optical member 700 may have various shapes. For example, the optical member 700 may have various shapes such as a polygonal shape, a circular shape, and an elliptical shape. The optical member 700 may have a shape corresponding to that of the light source module. The optical member 700 may have a shape corresponding to that of the lighting device 1000. The optical member 700 may include a transmissive region 710 and a non-transmissive region 720. The transmissive region 710 may be a region through which light emitted from the light source module is transmitted. The transmissive region 710 may overlap the light source module in a first direction (vertical direction; z-axis direction). In detail, the transmissive region 710 may be disposed in a region overlapping a portion of the plurality of unit reflective patterns 320 in a first direction. The transmissive region 710 may be provided in various shapes such as figures, numbers, texts, characters, symbols, and icons. Light emitted from the light source module may pass through the transmissive region 710 and be emitted outward, and output light corresponding to the shape of the transmissive region 710 may be visible outside the lighting device 1000. The non-transmissive region 720 is a region other than the transmissive region 710 and may be a region through which light emitted from the light source module is not transmitted. For example, the non-transmissive region 720 may be implemented using colored ink such as black.

The optical member 700 may be spaced apart from the light source module. The optical member 700 may be spaced apart from the light source module in the first direction (vertical direction; z-axis direction). A second gap B2 may be formed between the two components due to the separation of the optical member 700 and the light source module. The second gap B2 may be air or vacuum. The optical member 700 may be spaced apart from the resin layer 400. In detail, the optical member 700 may be spaced apart from the light source module in a first direction. The optical member 700 may be spaced apart from the light source module at a second height h2. Here, the second height h2 may be a distance between an upper surface of the protective layer 500 facing the optical member 700 and a lower surface of the optical member 700. The second height h2 may be smaller than the first height h1. For example, the second height h2 may be about 10 mm or less. In detail, the second height h2 may be about 1 mm to about 10 mm. When the second height h2 is less than about 1 mm, it may be difficult for light emitted from the light source module to be uniformly diffused within the second gap B2 having different refractive indices. In addition, when the second height h2 exceeds about 10 mm, a guiding distance of the light emitted from the light source module increases, which may cause light loss and increase the overall thickness of the lighting device 1000. The second height h2 preferably satisfies the aforementioned range in order to prevent light loss of the lighting device 1000 and implement uniform luminance. The optical member 700 may have set transmittance and reflectance and may have improved aesthetics. For example, the shape of the transmissive region 710 may correspond to the shape of a logo or emblem of a vehicle, and light passing through the light source module may be emitted to the surface light source and provided to the outside through the transmissive region 710. Thus, the light uniformity of the logo or emblem of the vehicle provided to the outside through the transmissive region 710 may be increased.

The lighting device 1000 according to the embodiment may effectively detect an object in front and provide uniform light to the front by arranging the light source module to overlap the sensor 10. In this case, the lighting device 1000 may prevent interference of signals emitted from the sensor 10 by placing the light source 200 and the electrode pattern 150 in a region that does not overlap with the sensor 10 in the first direction. Accordingly, it is possible to prevent the reliability and detection accuracy of the sensor 10 from being lowered by the light source module. Light emitted from the light source 200 may be uniformly reflected in a set direction by the reflective layer 300 and the plurality of unit reflective patterns 320 disposed on the reflective layer 300. Accordingly, the lighting device 1000 may provide light having a shape corresponding to the shape of the transmissive region 710 toward the front, and the provided light may have excellent luminance uniformity.

Figure 4:
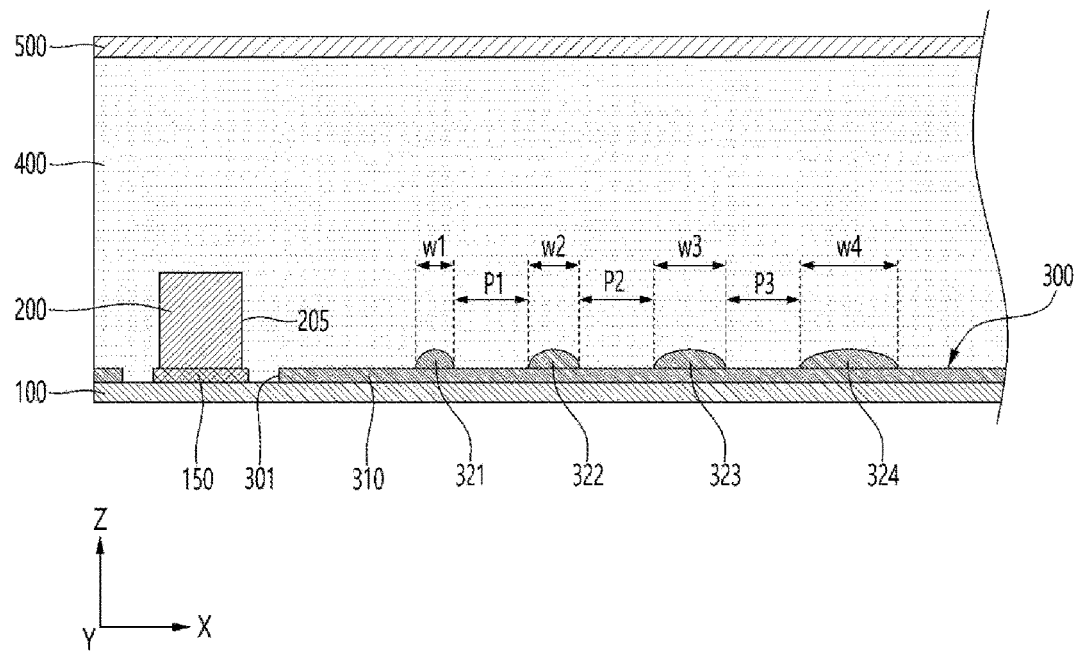
FIGS. 4 to 6 are other cross-sectional views for explaining arrangement relationship of unit reflective patterns in a light source module according to the embodiment.
Figure 5:
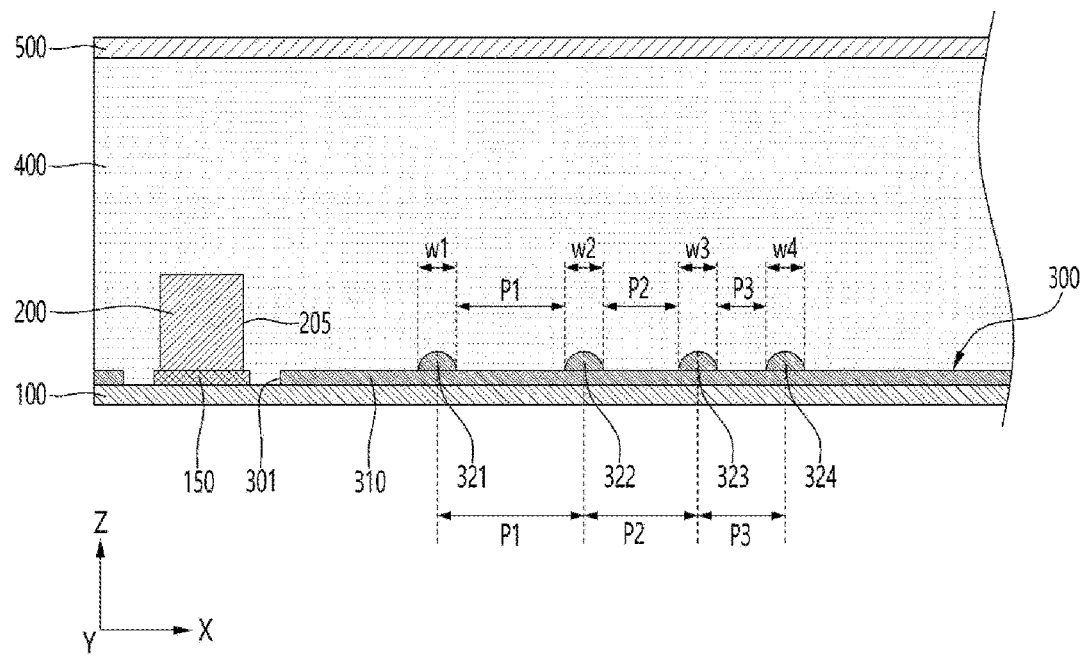
Figure 6:
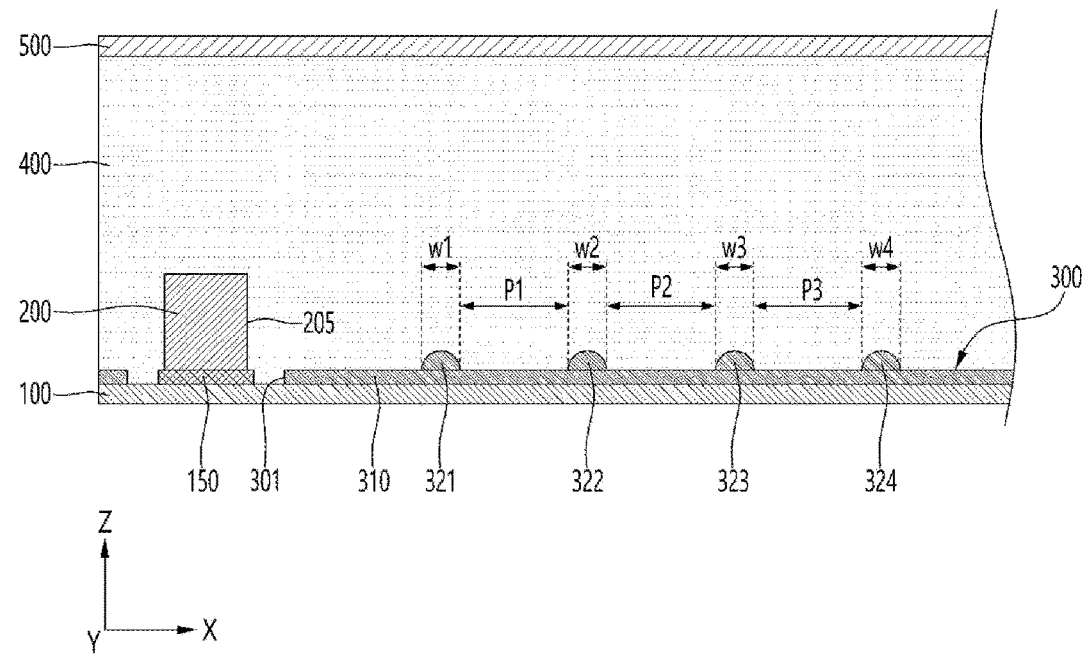

FIGS. 4 to 6 are other cross-sectional views for explaining arrangement relationships of unit reflective patterns in the light source module according to the exemplary embodiment. In the description using FIGS. 4 to 6, the same reference numerals are given to the same and similar components as those of the previously described light source module.

Referring to FIGS. 4 to 6. the reflective layer 300 may include a plurality of reflective pattern groups. In detail, the reflective layer 300 may include three or more reflective pattern groups, and each of the plurality of reflective pattern groups may include a plurality of unit reflective patterns 320. For example, the plurality of reflective pattern groups may include a first reflective pattern group G1, a second reflective pattern group G2, a third reflective pattern group G3, and a fourth reflective pattern group G4. Referring to FIG. 4, the first reflective pattern group G1 may include a plurality of unit reflective patterns 320 disposed on the virtual first line L1 and defined as a first reflective pattern 321. Each of the plurality of first reflective patterns 321 may have a first width w1. The second reflective pattern group G2 is disposed on the virtual second line L2 and may include a plurality of unit reflective patterns 320 defined as the second reflective pattern 322. The plurality of second reflective patterns 322 may be disposed closer to the center CP of the substrate 100 than the plurality of first reflective patterns 321 and may be spaced apart from the plurality of first reflective patterns 321 by the first gap P1 in the second direction.

Each of the second reflective patterns 322 may have a second width w2 greater than the first width w1. That is, the size (planar area) of the second reflective pattern 322 may be greater than the size (planar area) of the first reflective pattern 321. The third reflective pattern group G3 is disposed on the virtual third line L3 and may include a plurality of unit reflective patterns 320 defined as the third reflective pattern 323. The plurality of third reflective patterns 323 may be disposed closer to the center CP of the substrate 100 than the plurality of second reflective patterns 322 and may be spaced apart from the plurality of second reflective patterns 322 by the second interval P2 in the second direction. In this case, the second interval P2 may be the same as the first interval P1. Each of the third reflective patterns 323 may have a third width w3 greater than the second width w2. That is, the size (planar area) of the third reflective pattern 323 may be greater than the size (planar area) of the second reflective pattern 322.

The fourth reflective pattern group G4 is disposed on the virtual fourth line L4 and may include a plurality of unit reflective patterns 320 defined as the fourth reflective pattern 324. The plurality of fourth reflective patterns 324 may be disposed closer to the center CP of the substrate 100 than the plurality of third reflective patterns 323 and may be spaced apart from the plurality of third reflective patterns 323 by the third interval P3 in the second direction. In this case, the third interval P3 may be the same as the second interval P2. Each of the fourth reflective patterns 324 may have a fourth width w4 greater than the third width w3. That is, the size (planar area) of the fourth reflective pattern 324 may be greater than the size (planar area) of the third reflective pattern 323. That is, the distance between the plurality of reflective pattern groups in the light source module according to FIG. 4, for example, the distance between the unit reflective patterns 320 included in each reflective pattern group, may be constant without decreasing or increasing from the 2-2 region R2-2 toward the center CP of the substrate 100. That is, the first interval P1, the second interval P2, and the third interval P3 may be the same.

The size of the unit reflective pattern 320 may increase from the 2-2 region R2-2 toward the center CP of the substrate 100. In addition, the density of the unit reflective pattern 320 may increase in the direction of the center CP of the substrate 100 from the 2-2 region R2-2. In detail, the density of the pattern may be controlled by controlling the size (planar area) of the unit reflective patterns 320 included in each reflective pattern group. Accordingly, the reflective layer 300 may effectively reflect the light emitted from the light source 200 to provide uniform light.

Referring to FIG. 5, the first reflective pattern group G1 may include a plurality of unit reflective patterns 320 disposed on the virtual first line L1 and defined as a first reflective pattern 321. Each of the plurality of first reflective patterns 321 may have a first width w1. The second reflective pattern group G2 may include a plurality of second reflective patterns 322 disposed on the virtual second line L2 and disposed closer to the center CP of the substrate 100 than the plurality of first reflective patterns 321. The plurality of second reflective patterns 322 may be spaced apart from the plurality of first reflective patterns 321 by the first interval P1 in a second direction. Also, each of the second reflective patterns 322 may have a second width w2. and the second width w2 may be equal to the first width w1. That is, the size (planar area) of the second reflective pattern 322 may be the same as the size (planar area) of the first reflective pattern 321.

The third reflective pattern group G3 may include a plurality of third reflective patterns 323 disposed on the virtual third line L3 and disposed closer to the center CP of the substrate 100 than the plurality of second reflective patterns 322. The plurality of third reflective patterns 323 may be spaced apart from the plurality of second reflective patterns 322 by the second interval P2 in a second direction. In this case, the second interval P2 may be smaller than the first interval P1. Each of the third reflective patterns 323 may have a third width w3. and the third width w3 may be equal to the first width w1 and the second width w2. That is, the size (planar area) of the third reflective pattern 323 may be the same as the sizes (planar area) of the first reflective pattern 321 and the second reflective pattern 322. The fourth reflective pattern group G4 may include a plurality of fourth reflective patterns 324 disposed on the virtual fourth line L4 and disposed closer to the center CP of the substrate 100 than the plurality of third reflective patterns 323. The plurality of fourth reflective patterns 324 may be spaced apart from the plurality of third reflective patterns 323 in a second direction by the third distance P3. In this case, the third interval P3 may be smaller than the second interval P2.

Each of the fourth reflective patterns 324 may have a fourth width w4, and the fourth width w4 may be the same as the first width w1, the second width w2, and the third width w3. That is, the size (planar area) of the fourth reflective pattern 324 may be the same as the size (planar area) of the first reflective pattern 321, the second reflective pattern 322, and the third reflective pattern 323. That is, the distance between the plurality of reflective pattern groups in the light source module according to FIG. 5, for example, the distance between unit reflective patterns 320 included in each reflective pattern group, may be decrease from the 2-2 region R2-2 toward the center CP of the substrate 100. A size of the unit reflective pattern 320 may be constant without decreasing or increasing from the 2-2 region R2-2 toward the center CP of the substrate 100. In addition, the density of the unit reflective pattern 320 may increase in the direction of the center CP of the substrate 100 from the 2-2 region R2-2. In detail, the pattern density may be controlled by controlling the pitch interval of unit reflective patterns 320 included in each reflective pattern group or the intervals P1, P2, and P3 between each reflective pattern group. Accordingly, the reflective layer 300 may effectively reflect the light emitted from the light source 200 to provide uniform light.

Referring to FIG. 6, the first reflective pattern group G1 may include a plurality of unit reflective patterns 320 disposed on the virtual first line L1 and defined as a first reflective pattern 321. Each of the plurality of first reflective patterns 321 may have a first width w1. The second reflective pattern group G2 may include a plurality of second reflective patterns 322 disposed on the virtual second line L2 and disposed closer to the center CP of the substrate 100 than the plurality of first reflective patterns 321. The plurality of second reflective patterns 322 may be spaced apart from the plurality of first reflective patterns 321 by the first interval P1 in a second direction. Each of the second reflective patterns 322 may have a second width w2. and the second width w2 may be equal to the first width w1. That is, the size (planar area) of the second reflective pattern 322 may be the same as the size (planar area) of the first reflective pattern 321.

The third reflective pattern group G3 may include a plurality of third reflective patterns 323 disposed on the virtual third line L3 and disposed closer to the center CP of the substrate 100 than the plurality of second reflective patterns 322. The plurality of third reflective patterns 323 may be spaced apart from the plurality of second reflective patterns 322 by the second interval P2 in a second direction. In this case, the second interval P2 may be the same as the first interval P1. Each of the third reflective patterns 323 may have a third width w3, and the third width w3 may be equal to the first width w1 and the second width w2. That is, the size (planar area) of the third reflective pattern 323 may be the same as the sizes (planar area) of the first reflective pattern 321 and the second reflective pattern 322.

The fourth reflective pattern group G4 may include a plurality of fourth reflective patterns 324 disposed on the virtual fourth line L4 and disposed closer to the center CP of the substrate 100 than the plurality of third reflective patterns 323. The plurality of fourth reflective patterns 324 may be spaced apart from the plurality of third reflective patterns 323 in a second direction by the third interval P3. In this case, the third interval P3 may be the same as the first interval P1 and the second interval P2. Each of the fourth reflective patterns 324 may have a fourth width w4, and the fourth width w4 may be the same as the first width w1, the second width w2, and the third width w3. That is, the size (planar area) of the fourth reflective pattern 324 may be the same as the size (planar area) of the first reflective pattern 321, the second reflective pattern 322, and the third reflective pattern 323.

That is, the distance between the plurality of reflective pattern groups in the light source module according to FIG. 6, for example, the shortest interval between unit reflective patterns 320 included in each reflective pattern group, may be constant without decreasing or increasing from the 2-2 region R2-2 toward the center CP of the substrate 100. That is, the first interval P1, the second interval P2, and the third interval P3 may be the same. The size of the unit reflective pattern 320 may be constant without increasing or decreasing from the 2-2 region R2-2 toward the center CP of the substrate 100. In addition, the density of the unit reflective pattern 320 may increase in the direction of the center CP of the substrate 100 from the 2-2 region R2-2. In detail, the density of the pattern may be controlled by controlling the pitch interval of the unit reflective patterns 320 included in each reflective pattern group. Accordingly, the reflective layer 300 may effectively reflect the light emitted from the light source 200 to provide uniform light.

Figure 7:
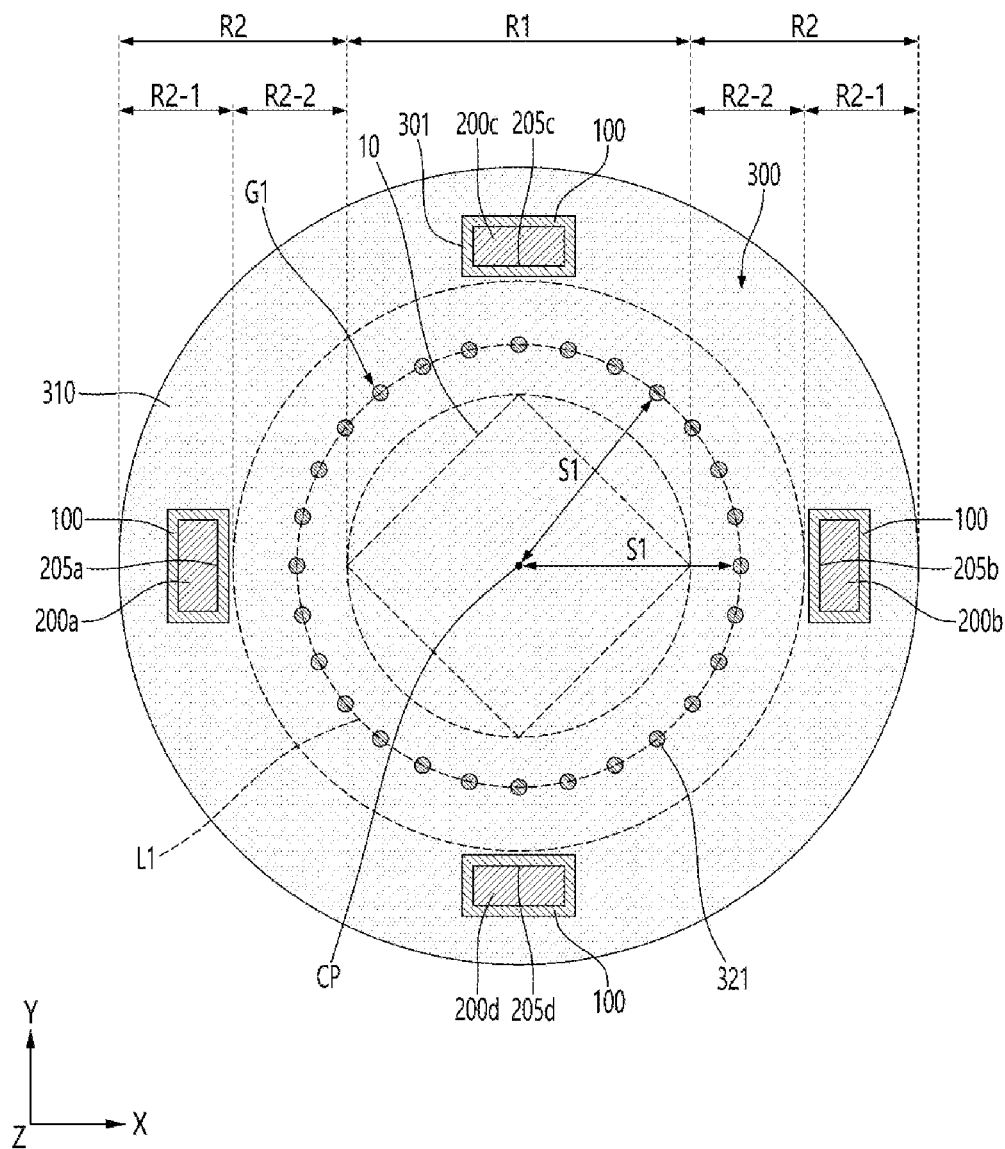
FIGS. 7 to 9 are diagrams for explaining various types of light source modules according to the embodiment.
Figure 8:
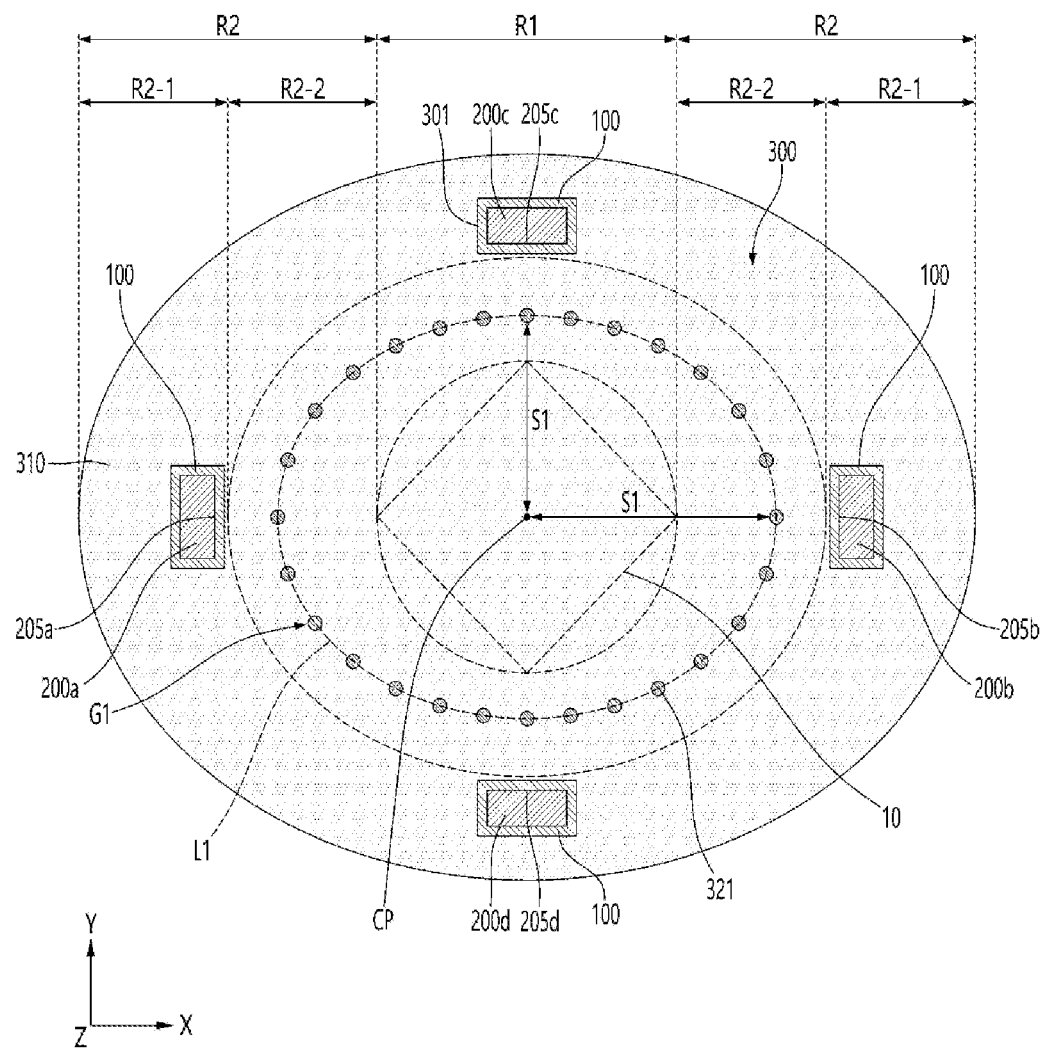
Figure 9:
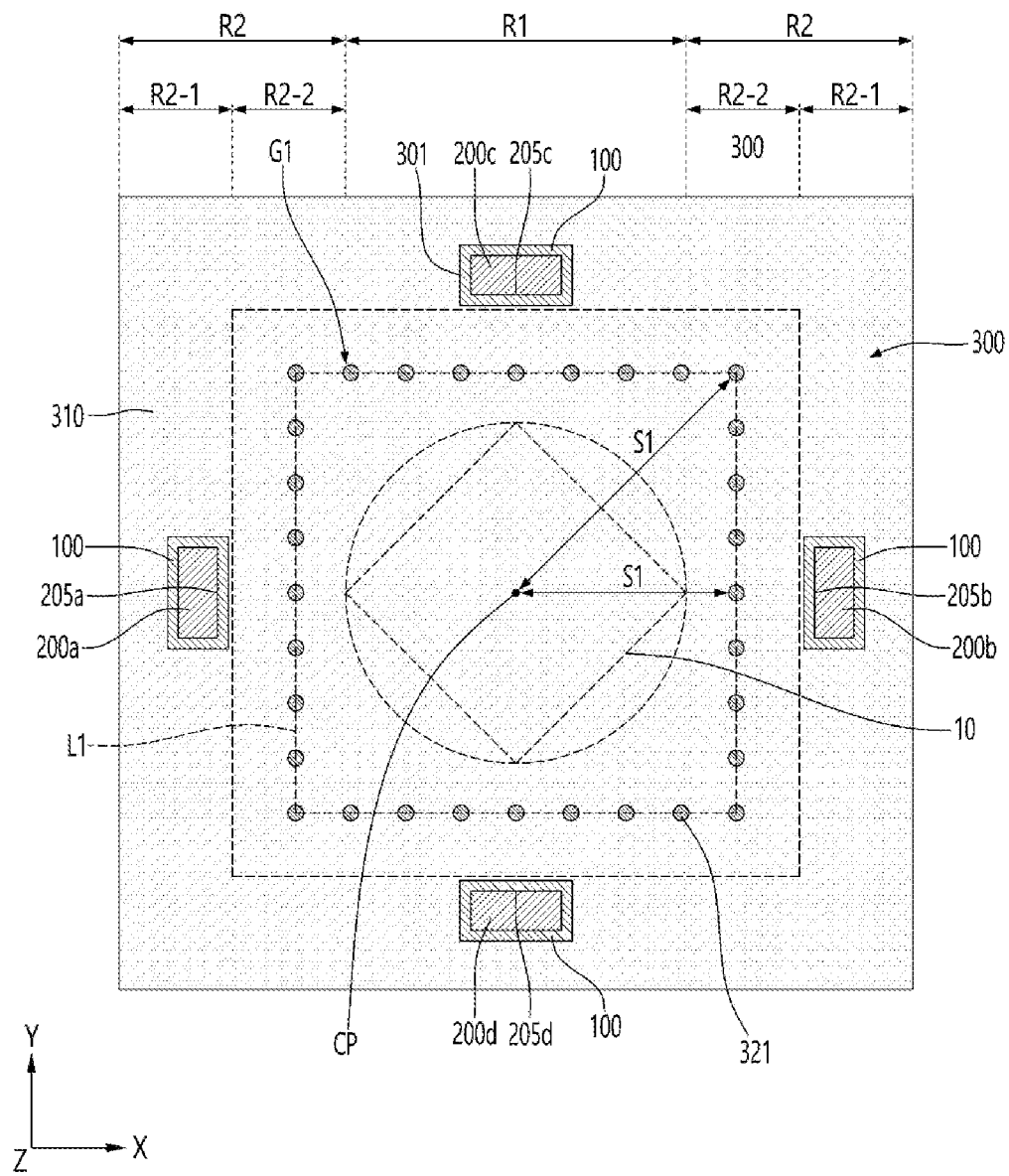

FIGS. 7 to 9 are diagrams for explaining various types of light source modules according to embodiments. In the description using FIGS. 7 to 9, the same reference numerals are given to the same and similar components as the previously described light source module and the same or similar configurations are omitted. The reflective layer 300 according to the embodiment may include a plurality of reflective pattern groups. The plurality of reflective pattern groups is provided in n number (where n is a natural number equal to or greater than 3), and each of the plurality of reflective pattern groups may include a plurality of unit reflective patterns 320. Each of the plurality of reflective pattern groups may include a plurality of unit reflective patterns 320 disposed along a virtual line forming a polygon, a circle, or an ellipse, and a shape of a virtual line formed by each of the plurality of reflective pattern groups and a distance characteristic between the unit reflective pattern 320 and the center CP of the substrate 100 may correspond to each other. Accordingly, in the description of FIGS. 7 to 9. the first reflective pattern group G1 will be mainly described for convenience of description.

Referring to FIG. 7. an upper shape of an optical module according to an embodiment may be circular. In this case, the substrate 100 and the resin layer 400 may have a circular shape, and an interval between a pair of light emitting devices included in each of the plurality of light emitting groups may be the same. For example, the first and second light emitting devices 200a and 200b of the first light emitting group may be spaced apart by the first separation distance dl, and the third and fourth light emitting devices 200c and 200d of the second light emitting group may also be spaced apart by the first separation distance dl. The first reflective pattern group G1 may include a plurality of unit reflective patterns 320, for example, a plurality of first reflective patterns 321 disposed along a virtual first line L1 forming a circle. The plurality of first reflective patterns 321 may be spaced apart from each other at equal intervals on the first line L1. For example, the plurality of first reflective patterns 321 adjacent to each other may be spaced apart at a first pitch interval.

A distance S1 between each of the plurality of first reflective patterns 321 from the center CP of the substrate 100 may be constant. In detail, the distance S1 between the center CP of the substrate 100 and each of the plurality of first reflective patterns 321 may be constant without changing in the clockwise direction. That is, the plurality of first reflective patterns 321 may be disposed at a constant distance from the center of the substrate 100 and may be disposed at equal intervals from patterns adjacent to each other. Accordingly, the reflective layer 300 may uniformly reflect the light emitted from the light source 200 in a set direction, for example, an upward direction in a light source module having a circular shape. Accordingly, the lighting device 1000 may improve luminance and luminance uniformity characteristics.

Referring to FIG. 8. an upper shape of an optical module according to an embodiment may be elliptical. In this case, the substrate 100 and the resin layer 400 may have an elliptical shape, and an interval between a pair of light emitting devices included in each of the plurality of light emitting groups may be different. For example, the first and second light emitting devices 200a and 200b of the first light emitting group may be spaced apart by the first separation distance dl, and the third and fourth light emitting devices 200c and 200d of the second light emitting group may be spaced apart by a third separation distance shorter than the first separation distance dl. The first reflective pattern group G1 may include a plurality of unit reflective patterns 320, for example, a plurality of first reflective patterns 321 disposed along a virtual first line L1 forming an ellipse. In this case, the shape of the first line L1 may correspond to the upper shape of the substrate 100 or the resin layer 400.

The plurality of first reflective patterns 321 may be spaced apart from each other at equal intervals on the first line L1. For example, the plurality of first reflective patterns 321 adjacent to each other may be spaced apart at a first pitch interval. A distance S1 between each of the plurality of first reflective patterns 321 from the center CP of the substrate 100 may vary. In detail, as the first line L1 has an oval shape, the distance S1 between the center CP of the substrate 100 and each of the first reflective patterns 321 may increase or decrease along a clockwise direction. That is, the plurality of first reflective patterns 321 may be arranged at equal intervals from adjacent patterns, and the distance from the center of the substrate 100 may vary. Accordingly, the reflective layer 300 can uniformly reflect the light emitted from the light source 200 in a set direction, for example, an upward direction in a light source module having an elliptical shape. Accordingly, the lighting device 1000 can improve luminance and luminance uniformity characteristics.

Referring to FIG. 9. an upper shape of an optical module according to an embodiment may be a polygonal shape. In this case, the substrate 100 and the resin layer 400 may have polygonal shapes, and intervals between a pair of light emitting devices included in each of the plurality of light emitting groups may be the same or different. In detail, when the polygon is a regular n-angle, the intervals between a pair of light emitting devices included in each of the plurality of light emitting groups may be the same, and when the polygon is not a regular n-angle, the intervals may be different. When the polygon is a regular n-angle, the first and second light emitting devices 200a and 200b of the first light emitting group may be spaced apart by the first separation distance dl, and the third and fourth light emitting devices 200c and 200d of the second light emitting group may also be spaced apart by the first separation distance dl.

The first reflective pattern group G1 may include a plurality of unit reflective patterns 320, for example, a plurality of first reflective patterns 321 disposed along a virtual first line L1 forming an n-angle. In this case, the shape of the first line L1 may correspond to the upper shape of the substrate 100 or the resin layer 400. The plurality of first reflective patterns 321 may be spaced apart from each other at equal intervals on the first line L1. For example, the plurality of first reflective patterns 321 adjacent to each other may be spaced apart at a first pitch interval. A distance between each of the plurality of first reflective patterns 321 at the center CP of the substrate 100 may vary. In detail, as the first line L1 has an equilateral n-angular shape, the distance between the center CP of the substrate 100 and each of the first reflective patterns 321 may increase or decrease along a clockwise direction. For example, the distance S1 from the center of the substrate 100 may be greater for the first reflective pattern 321 disposed adjacent to the vertex of the regular n-angle of the first line L1.

When the polygon is not a regular n-angle, the first and second light emitting devices 200a and 200b of the first light emitting group may be spaced apart by the first separation distance dl, and the third and fourth light emitting devices 200c and 200d of the second light emitting group may be spaced apart by a third distance shorter than the first separation distance dl. A distance S1 between each of the plurality of first reflective patterns 321 from the center CP of the substrate 100 may vary. In detail, as the first line L1 has a polygonal shape, the center CP of the substrate 100 and the distance S1 of each of the first reflective patterns 321 may increase or decrease along a clockwise direction. That is, the plurality of first reflective patterns 321 may be arranged at equal intervals from adjacent patterns, and the distance from the center of the substrate 100 may vary. Accordingly, the reflective layer 300 may uniformly reflect light emitted from the light source 200 in a set direction, for example, an upward direction in a light source module having a polygonal shape. Accordingly, the lighting device 1000 may improve luminance and luminance uniformity characteristics.

Figure 10:
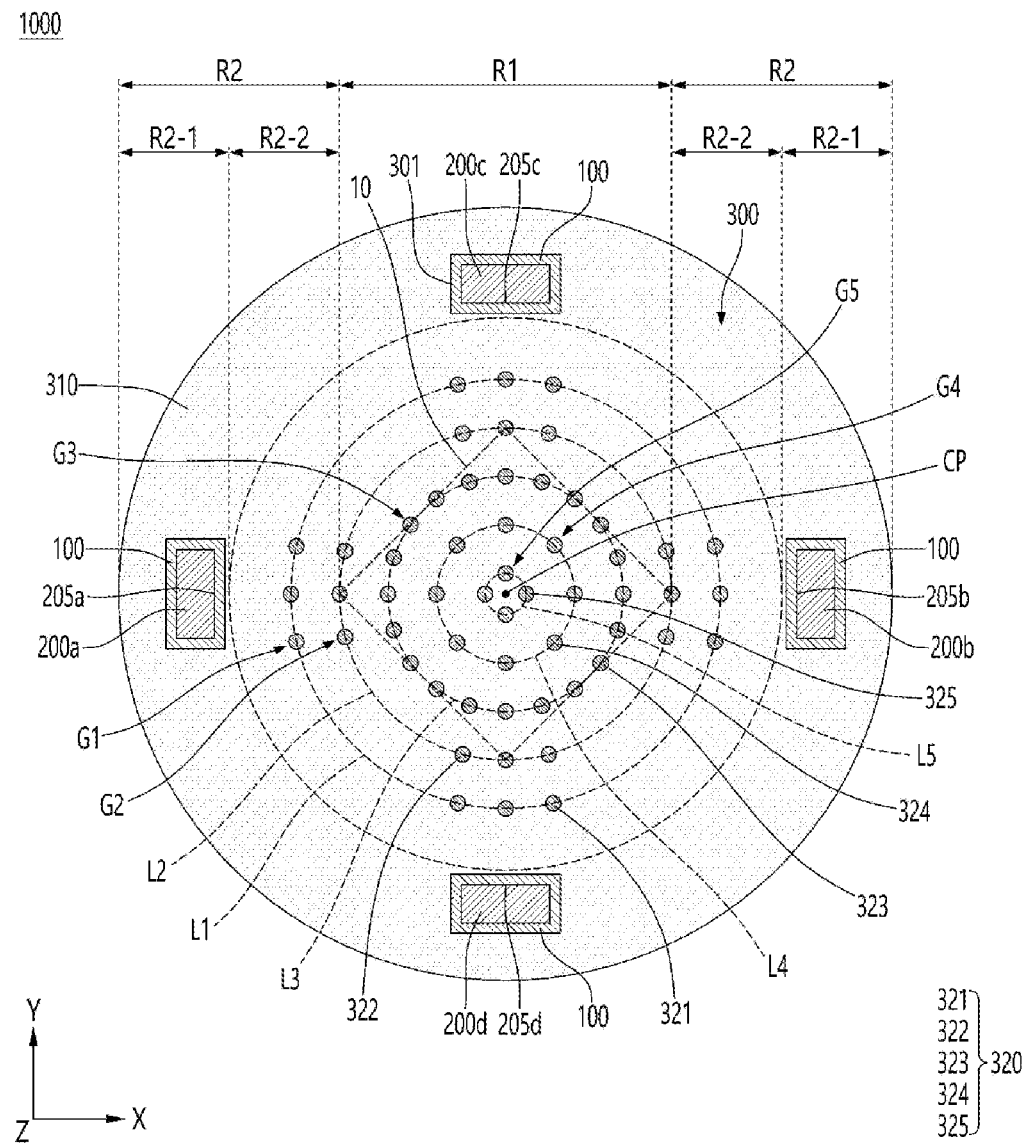
FIG. 10 is a plan view for explaining another arrangement relationship of unit reflective patterns in the light source module according to the embodiment.

FIG. 10 and a plan view for explaining another arrangement relationship of unit reflective patterns in the light source module according to the exemplary embodiment. In the description using FIG. 10, the same reference numerals are assigned to the same and similar components, while the same and similar configurations as those of the previously described light source module are omitted.

Referring to FIG. 10. the light source 200 may include a plurality of light emitting devices. The plurality of light emitting devices may be disposed along an edge of the substrate 100. For example, the plurality of light emitting devices may be arranged on a virtual line forming a polygon, circle, or ellipse having the center CP of the substrate 100 as a center point. The plurality of light emitting devices may be spaced apart from each other on the virtual line. The reflective layer 300 may include a plurality of unit reflective patterns 320 disposed on the optical sheet 310. The plurality of unit reflective patterns 320 may be disposed on a movement path of light emitted from the light emitting device and/or a movement path of light emitted from the light emitting device and reflected to other components. The plurality of unit reflective patterns 320 may be disposed on a partial region compared to the light source module according to FIG. 2. For example, the plurality of unit reflective patterns 320 may be disposed in a region corresponding to an emission path and beam angle of light emitted from the light emitting device. In detail, a relatively small amount of light may be provided to a region located at a relatively long distance from the light emitting surface of the light emitting device or not located within an angle of view of the light emitting device. For example, a relatively small amount of light may be provided to a region corresponding to a region between adjacent light emitting devices. In this case, the effect of light being reflected by the unit reflective patterns 320 disposed in the region may be insignificant.

Therefore, in the light source module according to FIG. 10, the unit reflective pattern 320 may be placed in a region corresponding to the emission path and orientation angle of light emitted from the light emitting device, and may not be placed in a region where a relatively small amount of light is provided as described above.

For example, when the light source 200 emits light toward the center of the substrate 100 and includes the plurality of light emitting devices spaced apart from each other, the plurality of unit reflective patterns 320 may extend from the center CP of the substrate 100 toward each of the plurality of light emitting devices. For example, when the light sources 200 are spaced apart from each other as shown in FIG. 10 and include first to fourth light emitting devices 200a, 200b, 200c, and 200d that emit light toward the center CP of the substrate 100, the plurality of unit reflective patterns 320 may have a shape extending from the center CP of the substrate 100 toward each of the first to fourth light emitting devices 200a, 200b, 200c, and 200d. That is, when viewing the region where the plurality of unit reflective patterns 320 are disposed from the top, the region may have a plus (+) shape. Accordingly, light emitted from the light source 200 may be uniformly reflected in a direction set by the reflective layer 300 and the plurality of unit reflective patterns 320. In this case, the plurality of unit reflective patterns 320 may minimize the number of unit reflective patterns 320 disposed at a position considering the emission direction and orientation angle of the light source 200 and provide uniform luminance light in the upper direction.

Figure 11:
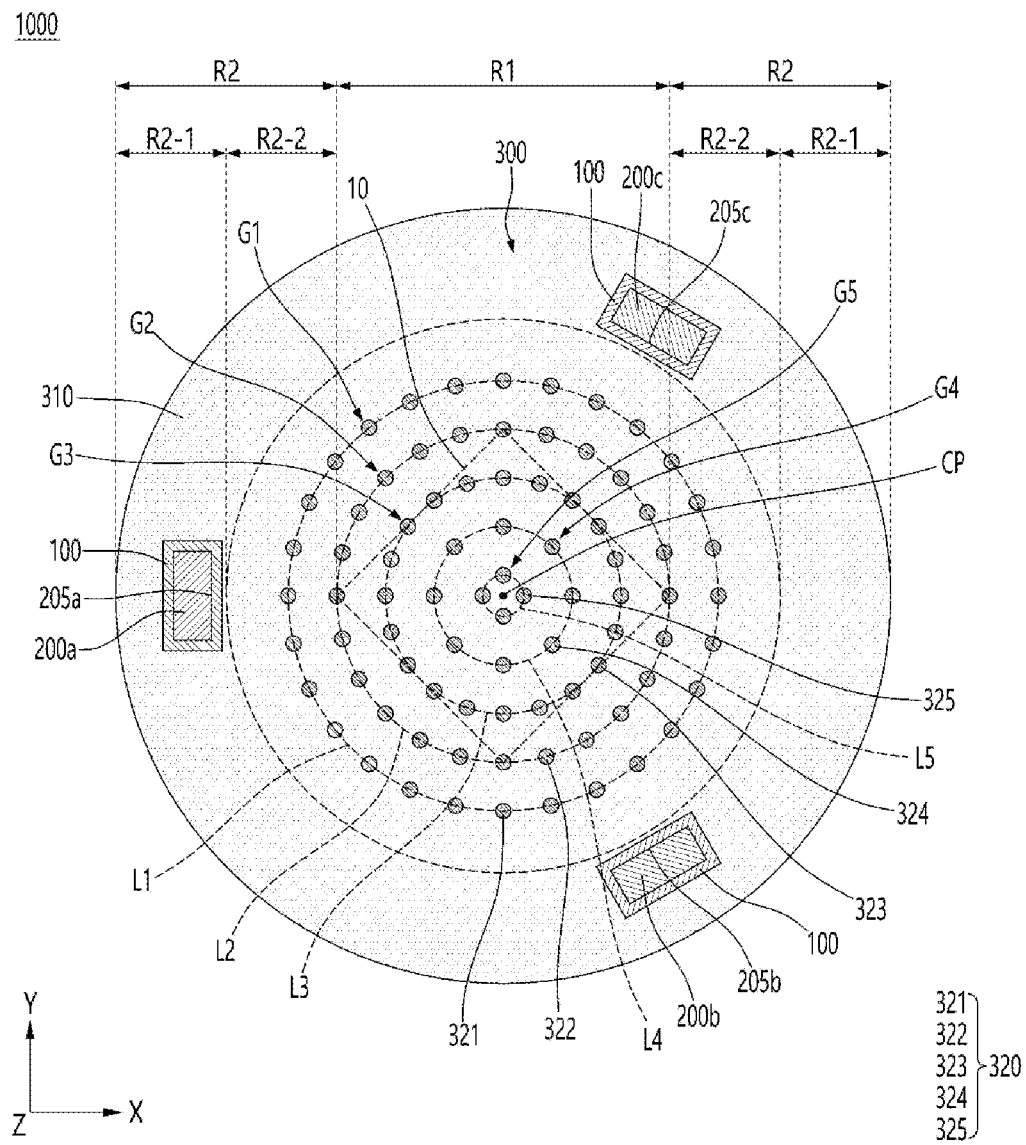
FIG. 11 is a plan view for explaining another arrangement relationship of light sources in a light source module according to the embodiment.

FIG. 11 is a plan view for explaining another arrangement relationship of light sources in a light source module according to the embodiment. In the description using FIG. 11, the same reference numerals are assigned to the same and similar components, while the same and similar configurations as those of the previously described light source module are omitted.

Referring to FIG. 11. the light source 200 may include a plurality of light emitting devices. The plurality of light emitting devices may be disposed along an edge of the substrate 100. For example, the plurality of light emitting devices may be arranged on a virtual line forming a polygon, circle, or ellipse having the center CP of the substrate 100 as a center point. The plurality of light emitting devices may be spaced apart from each other on the virtual line. The plurality of light emitting devices may be disposed at regular intervals, for example, at regular intervals according to the shape of the virtual line. 2n+1 (where n is a natural number) number of the plurality of light emitting devices may be disposed. In this case, the plurality of light emitting devices may be arranged so as not to correspond to each other based on the center CP of the substrate 100. For example, when three light emitting devices are provided to include a first light emitting device 200a, a second light emitting device 200b, and a third light emitting device 200c, each of the first to third light emitting devices 200a, 200b, and 200c may be disposed corresponding to the center CP of the substrate 100. In detail, light emitting surfaces 205a, 205b, and 205c of each of the first to third light emitting devices 200a, 200b, and 200c are disposed to face the center CP of the substrate 100, but each of the light emitting surfaces 205a, 205b, and 205c may not face each other in the second direction (horizontal direction). In more detail, the first to third light emitting devices 200a, 200b, and 200c may be disposed such that each optical axis crosses the center CP of the substrate 100 at an overlapping point. Accordingly, light emitted from the light source 200 may be uniformly reflected in a direction set by the reflective layer 300 and the plurality of unit reflective patterns 320. Accordingly, the lighting device 1000 may minimize light loss and provide light with uniform luminance in an upward direction.

Figure 12:
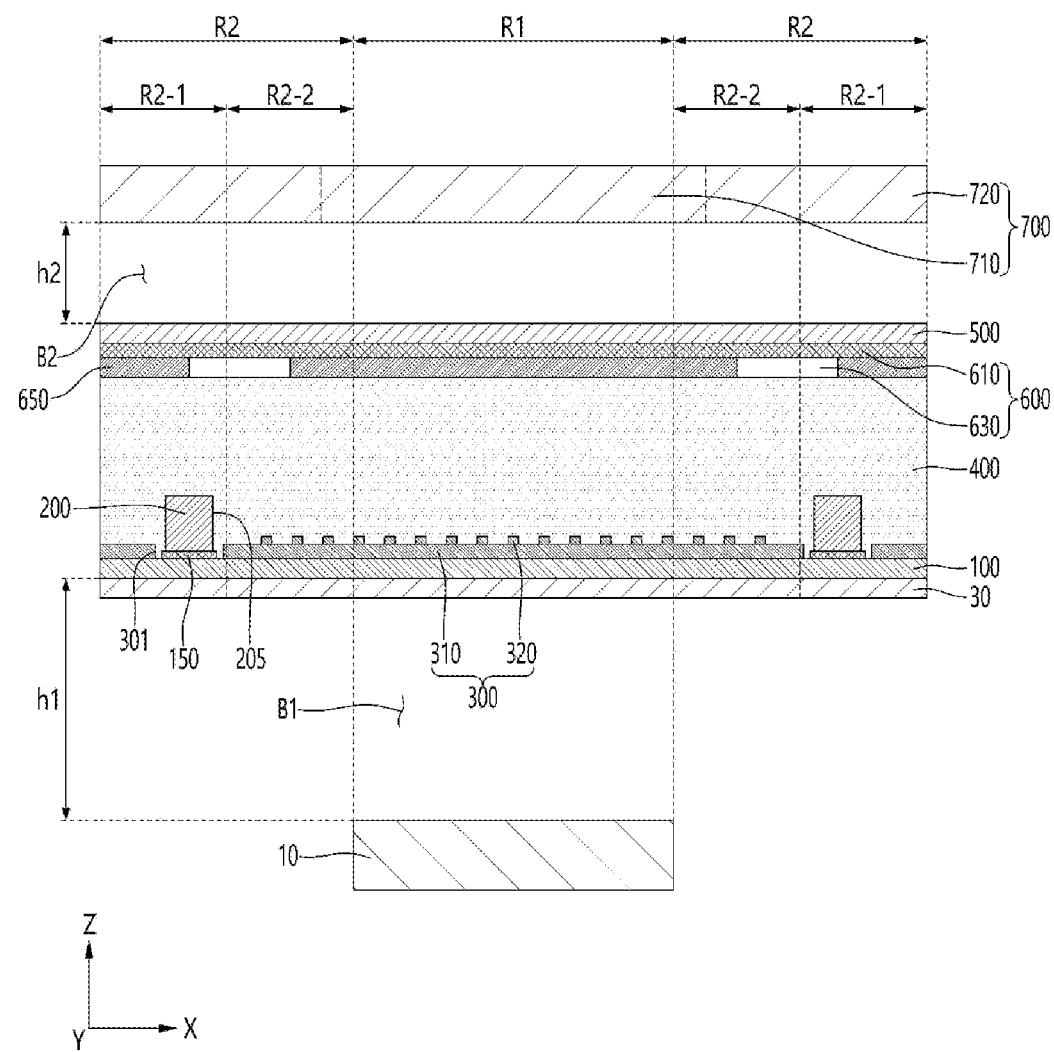
FIGS. 12 and 13 are other cross-sectional views of a lighting device according to the embodiment.

FIG. 12 is another cross-sectional view of a lighting device according to the embodiment. In the description using FIG. 12, the same reference numerals are assigned to the same and similar components as the above-described lighting device and the same or similar configurations are omitted.

Referring to FIG. 12. the lighting device 1000 may include a light blocking layer 600. The light blocking layer 600 may be disposed on the resin layer 400. In detail, the light blocking layer 600 may be disposed on the upper surface of the resin layer 400 and may be disposed between the resin layer 400 and the protective layer 500. The light blocking layer 600 may include a first substrate 610 and a light blocking pattern 630. The first substrate 610 may be disposed on an upper surface of the resin layer 400. The first substrate 610 may include a light-transmitting material. For example, the first substrate 610 may include at least one of PET (Polyethylene terephthalate), PS (Polystyrene), PI (Polyimide), PEN (Polyethylene naphthalate), PC (Poly carbonate). The first substrate 610 may have a set thickness. For example, the thickness of the first substrate 610 may be about 150 μm or less. In detail, the thickness of the first substrate 610 may be about 100 μm or less. In more detail, the thickness of the first substrate 610 may be about 20 μm to about 100 μm. The first substrate 610 may be provided in the form of a light-transmissive film having a set thickness.

The light blocking pattern 630 may be disposed on the first substrate 610. The light blocking pattern 630 may be disposed on at least one of a lower surface of the first substrate 610 facing the resin layer 400 and an upper surface opposite to the lower surface. For example, the light blocking pattern 630 may be disposed on the lower surface of the first substrate 610. The light blocking pattern 630 may be overlapped and printed as a plurality of layers on the lower surface of the first substrate 610. Also, the light blocking pattern 630 may have a structure including a plurality of patterns having different sizes. When the light blocking pattern 630 is viewed from above, the light blocking pattern 630 may have various shapes such as a circular shape, an elliptical shape, and a polygonal shape. For example, the planar shape of the light blocking pattern 630 may have a shape including a curve in consideration of an emission direction and an angle of view of the light emitting device, and may have a shape extending along the emission direction of the light emitting device.

The number of light blocking patterns 630 may be greater than or equal to the number of lights emitting devices. Also, the light blocking pattern 630 may be disposed in a region corresponding to the light source 200. In detail, a portion of the light blocking pattern 630 may overlap the light source 200 in a first direction (vertical direction; z-axis direction). Also, the light blocking pattern 630 may be disposed in a region that does not overlap with the sensor 10 in the first direction. An adhesive layer 650 may be disposed around the light blocking pattern 630. The adhesive layer 650 may be disposed between the resin layer 400 and the first substrate 610. The adhesive layer 650 may be disposed on a region of the lower surface of the first substrate 610 where the light blocking pattern 630 is not disposed. The adhesive layer 650 may include a light-transmitting adhesive material. The adhesive layer 650 may adhere the resin layer 400 and the light blocking layer 600 to each other. That is, the lighting device 1000 according to the embodiment may include the light blocking layer 600 to improve luminance uniformity characteristics. In detail, the light blocking layer 600 includes a light blocking pattern 630, and the light blocking pattern 630 may be disposed in a region where light emitted from the light emitting device may be concentrated. Accordingly, the lighting device 1000 according to the embodiment may prevent a hot spot from being formed by the light emitted from the light source 200.

Figure 13:
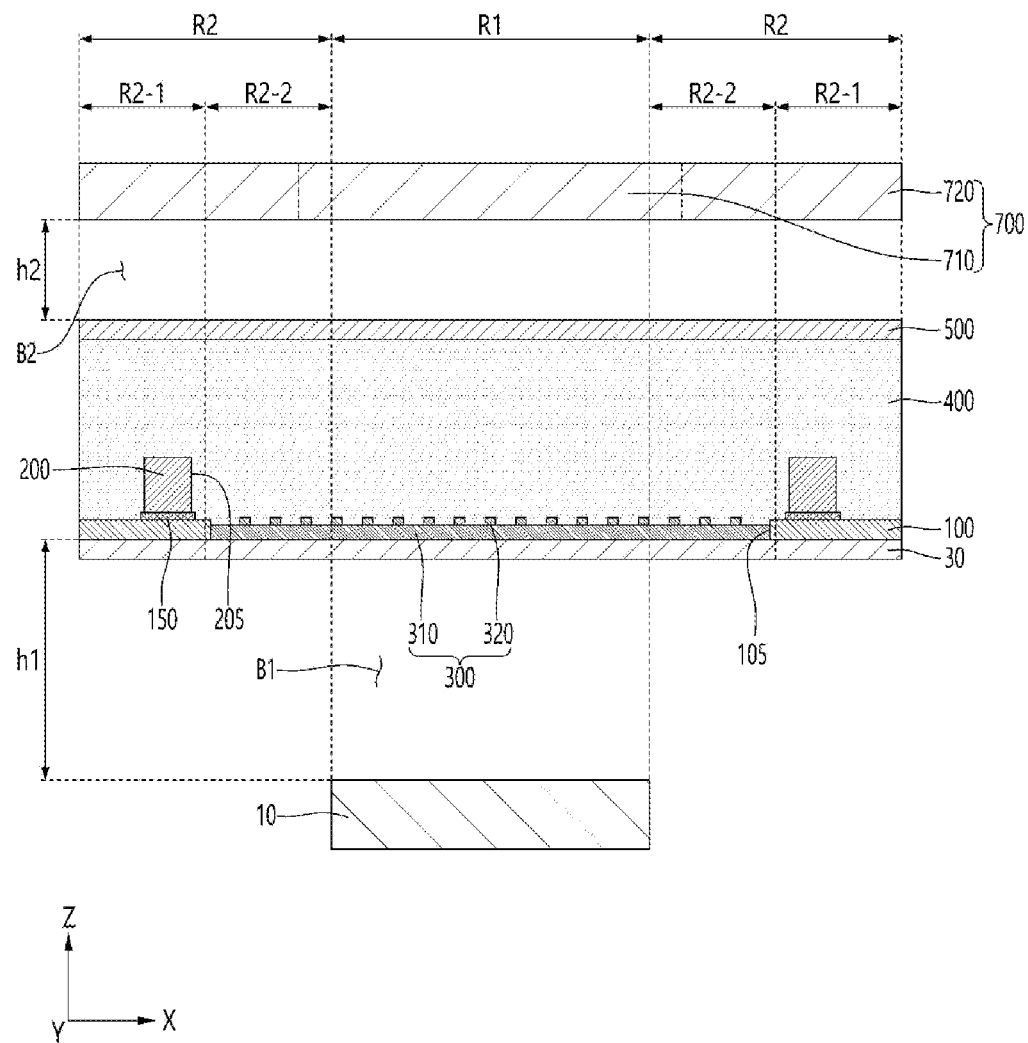

FIG. 13 is another cross-sectional view of a lighting device according to an embodiment. In the description using FIG. 13, the same reference numerals are given to the same and similar components as those of the above-described lighting device and the description is omitted.

Referring to FIG. 13. an opening 105 may be formed in the substrate 100. The opening 105 of the substrate 100 may be a hole passing through an upper surface facing the resin layer 400 and a lower surface facing the housing 30. The opening 105 may expose a portion of the upper surface of the housing 30. The opening 105 may be formed in a center region of the substrate 100. The opening 105 may be formed in the first region R1 of the substrate 100. The sensor 10 may overlap the opening 105 in a first direction. Also, the opening 105 may be formed in the second region R2 of the substrate 100. In detail, the opening 105 may not be formed in the 2-1 region R2-1 in which the light source 200 is disposed, but may be formed in the 2-2 region R2-2 in which the light source 200 is not disposed. The substrate 100 may have a donut shape having a center region penetrated by the opening 105. When the substrate 100 includes the opening 105 as described above, the location of the reflective layer 300 may be different from that of the above-described embodiment. For example, the reflective layer 300 may not be disposed on the upper surface of the substrate 100 but may be disposed on the housing 30 corresponding to the opening 105. In detail, the reflective layer 300 may be disposed on an upper surface of the housing 30 exposed through the opening 105. The reflective layer 300 may have a planar shape corresponding to the opening 105 and may be provided with a corresponding width. That is, the reflective layer 300 may be disposed while covering the entire exposed upper surface of the housing 30. In this case, the lower surface of the reflective layer 300 and the lower surface of the substrate 100 may be disposed on the same plane. Also, the upper surface of the reflective layer 300 may be disposed lower than the upper surface of the substrate 100. Accordingly, light emitted from the light source 200 may be more effectively provided to the reflective layer 300. In detail, as the upper surface of the reflective layer 300 is disposed below the upper surface of the substrate 100, light emitted from the light source 200 may be effectively provided to the upper surface of the reflective layer 300 and may be prevented from being incident on the side surface of the reflective layer 300. Also, since the substrate 100 includes the opening 105, a contact area between the resin layer 400 and the substrate 100 may increase. Accordingly, since the substrate 100 and the resin layer 400 may be more firmly coupled, and may have improved reliability.

Figure 14:
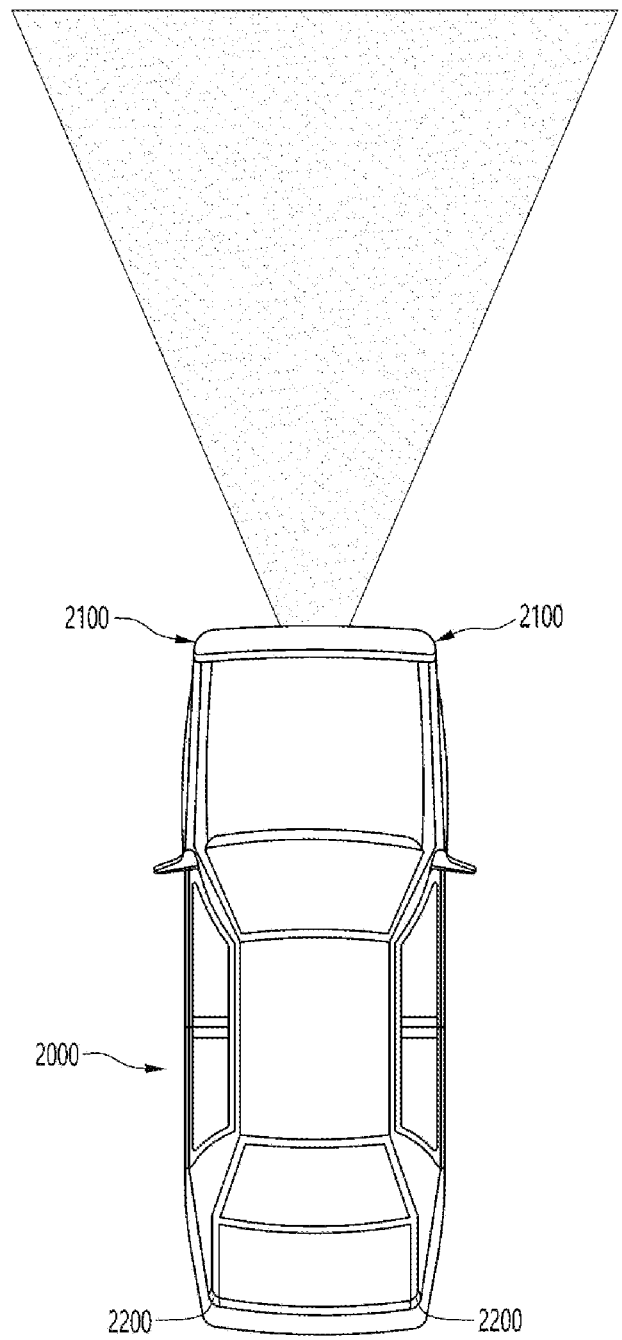
FIGS. 14 to 17 are diagrams illustrating examples in which a lamp including a lighting device according to the embodiment is applied to a vehicle.
Figure 15:
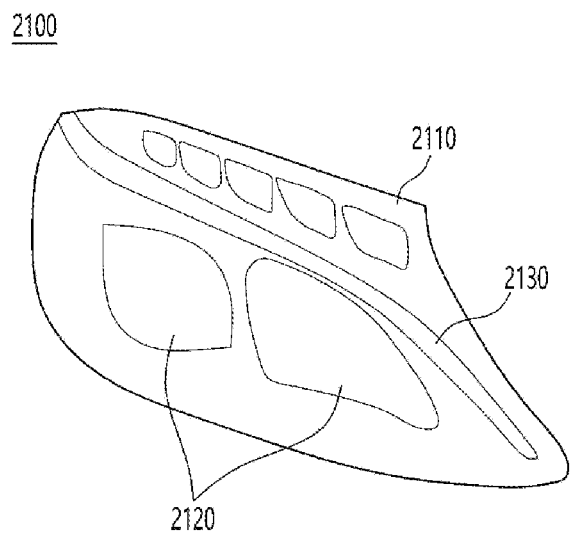
Figure 16:
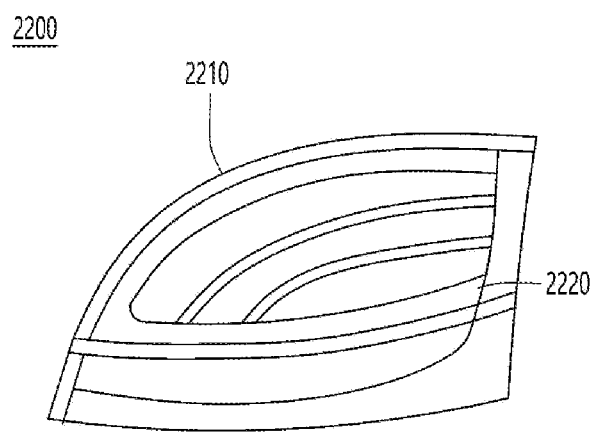
Figure 17:
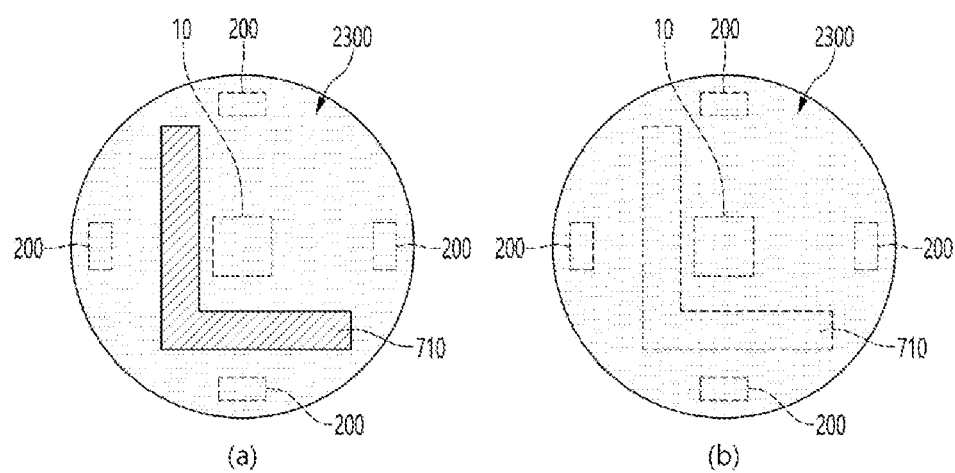

FIGS. 14 to 17 are diagrams illustrating examples in which a lamp including a lighting device according to an embodiment is applied to a vehicle. FIG. 14 is a top view of a vehicle to which a lamp having a lighting device according to an embodiment is applied, FIG. 15 is an example in which a lamp having the lighting device is disposed in front of the vehicle, and FIG. 16 is an example in which the lighting device is disposed in the rear of the vehicle. FIG. 17 is a diagram showing an example in which a lamp having the lighting device is applied to a logo, for example, an emblem located on the exterior of a vehicle.

Referring to FIGS. 14 to 17. a lighting device 1000 according to the embodiment may be applied to a vehicle 2000. One or more lamps may be disposed in at least one of the front, rear, and lateral sides of the vehicle 2000. For example, referring to FIG. 15. the lamp may be applied to a front lamp 2100 of a vehicle. The front lamp 2100 may include a first cover member 2110 and at least one first lamp module 2120 including the lighting device 1000. The first cover member 2110 accommodates the first lamp module 2120 and may be made of a light-transmitting material. The first cover member 2110 may have a curve according to the design of the vehicle 2000 and may be provided in a flat or curved shape according to the shape of the first lamp module 2120. The front lamp 2100 may provide a plurality of functions by controlling the driving timing of the lighting device 1000 included in the first lamp module 2120. For example, the front lamp 2100 may provide at least one function of a headlamp, a turn signal lamp, a daytime running lamp, a high lamp, a low lamp, and a fog lamp by light emitted from the lighting device 1000. In addition, the front lamp 2100 may provide additional functions such as a welcome light or a celebration effect when the driver opens the vehicle door.

The front lamp 2100 may detect an object located in the front. In detail, the front lamp 2100 may provide the light emitting function described above and at the same time detect an object located in the front using the sensor 10 of the lighting device 1000. Based on this, the front lamp 2100 may provide functions such as forward collision-avoidance assist (FCA), smart cruise control (SCC), and adaptive cruise control (ACC).

Referring to FIG. 16. the lamp may be applied to a rear lamp 2200 of a vehicle. The rear lamp 2200 may include a second cover member 2210 and at least one second lamp module 2220 including the lighting device 1000. The second cover member 2210 accommodates the second lamp module 2220 and may be made of a light-transmitting material. The second cover member 2210 may have a curve according to the design of the vehicle 2000 and may be provided in a flat or curved shape according to the shape of the second lamp module 2220. The back lamp 2200 may provide a plurality of functions by controlling the driving timing of the lighting device 1000 included in the second lamp module 2220. For example, the rear lamp 2200 may provide at least one function of a sidelight, a brake light, and a direction indicator light by light emitted from the lighting device 1000. In addition, the rear lamp 2200 can detect an object located in the rear or rear side. In detail, the rear lamp 2200 may provide the above-described light emitting function and at the same time detect an object located in the rear or rear side by using the sensor 10 of the lighting device 1000. Based on this, the rear lamp 2200 can provide functions such as a blind spot detection system (BSD) and a rear side collision warning.

Referring to FIGS. 14 and 17. the lamp may be applied to an emblem lamp 2300 of a vehicle. The emblem lamp 2300 may be provided in at least one region of the front, side, and rear of the vehicle 2000. The emblem lamp 2300 may be provided at the front of the vehicle. For example, the emblem lamp 2300 may be disposed in a front center region of the vehicle 2000, such as a radiator grill or a bonnet. The emblem lamp 2300 may provide various functions by controlling the driving timing of the lighting device 1000. For example, the emblem lamp 2300 may emit light as shown in FIG. 17(*a*). In this case, the emblem lamp 2300 may emit light having a shape corresponding to the shape of the transmissive region 710 of the optical member 700. In detail, the emblem lamp 2300 may emit light in the shape of an emblem symbolizing the manufacturer or brand of the vehicle 2000. In addition, when the emblem lamp 2300 is non-lighted as shown in FIG. 17(*b*), the inside of the emblem lamp 2300, such as the shape of the transmissive region 710, may not be visible from the outside of the vehicle 2000. In addition, when the optical member 700 corresponds to the color of the vehicle 2000, the emblem lamp 2300 may minimize or prevent external visibility and thus have a hidden effect.

The emblem lamp 2300 may detect an object located in front. In detail, the emblem lamp 2300 provides the above-described light emitting function and is disposed in the center region of the front of the vehicle 2000 to more effectively detect an object located in front. Based on this, the emblem lamp 2300 may provide functions such as forward collision-avoidance assist (FCA), smart cruise control (SCC), and adaptive cruise control (ACC). That is, in the lighting device 1000 and the lamp according to the embodiment, the light source module is arranged to overlap the sensor 10 to effectively detect an object in front and at the same time provide uniform light to the front. In detail, in the lighting device 1000, elements that may cause interference with the sensor 10, such as the electrode pattern 150 and the light source 200, may be arranged so as not to overlap with the sensor 10. Accordingly, the lighting device 1000 may provide light having excellent luminance uniformity toward the front and prevent deterioration in detection accuracy.

Features, structures, effects, etc. described in the above embodiments are included in at least one embodiment of the invention, and are not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and modifications should be interpreted as being included in the scope of the invention.

In addition, although described based on the embodiments above, this is only an example, not limiting this invention, it will be apparent to those skilled in the art that various modifications and applications not illustrated above can be made without departing from the essential characteristics of this embodiment. For example, each component specifically shown in the embodiment can be modified and implemented. And the differences related to these modifications and applications should be construed as being included in the scope of the invention as defined in the appended claims.

The invention claimed is:

1. A lighting device comprising:
   a sensor;
   a substrate disposed on the sensor and including an electrode pattern;
   a light source disposed on the substrate and electrically connected to the electrode pattern;
   a resin layer disposed on the substrate;
   a reflective layer disposed between the substrate and the resin layer and having a plurality of reflective pattern groups; and
   an optical member disposed on the resin layer and including a transmissive region and a non-transmissive region,
   wherein the substrate includes a first region overlapping the sensor in a first direction perpendicular to an upper surface of the substrate; and a second region surrounding the first region,
   wherein the light source is disposed on the second region,
   wherein the plurality of reflective pattern groups is disposed on the first region,
   wherein the sensor does not overlap the light source and the electrode pattern in the first direction,
   wherein the light source includes a plurality of light emitting devices having light emitting diode,
   wherein each of the plurality of light emitting devices includes a light emitting surface that emits light toward a side surface of the lighting device,
   wherein the plurality of light emitting devices are buried to a lower portion of the resin layer, wherein the optical member is spaced apart from the resin layer, and wherein a separation distance between the substrate and the sensor is greater than a separation distance between the resin layer and the optical member.

2. The lighting device of claim 1, wherein each of the plurality of reflective pattern groups includes a plurality of unit reflective patterns.

3. The lighting device of claim 2, wherein the second region comprises:

a 2-1 region in which the light source is disposed; and a 2-2 region disposed between the first region and the 2-1 region, and wherein the plurality of unit reflective patterns is further disposed on the 2-2 region.

4. The lighting device of claim 3, wherein a maximum interval between the plurality of unit reflective patterns disposed on the first region is smaller than a maximum interval between the plurality of unit reflective patterns disposed on the 2-2 region.

5. The lighting device of claim 3, wherein a size of each of the plurality of unit reflective patterns disposed on the first region is greater than a size of each of the plurality of unit reflective patterns disposed on the 2-2 region.

6. The lighting device of claim 3, wherein the plurality of unit reflective patterns does not overlap the 2-1 region in the first direction.

7. The lighting device according to claim 1, wherein the light source is not disposed in the first region.

8. The lighting device of claim 2, wherein the reflective layer comprises an optical sheet, and wherein the plurality of unit reflective patterns is disposed on the optical sheet.

9. The lighting device of claim 1, comprising a light blocking layer disposed on the resin layer, wherein the light blocking layer includes a first substrate and a light blocking pattern disposed on the first substrate, and wherein a portion of the light blocking pattern overlaps the light source in a vertical direction.

10. The lighting device of claim 1, comprising a housing disposed between the sensor and the substrate, wherein the substrate includes an opening penetrating an upper surface and a lower surface, wherein the opening is formed in a center region of the substrate overlapping the sensor in the first direction, wherein the reflective layer is disposed on the housing corresponding to the opening, and wherein an upper surface of the reflective layer is disposed lower than the upper surface of the substrate.

11. The lighting device of claim 1, wherein the sensor includes a lidar that transmits and receives signals for detecting an object, and wherein the substrate is formed of a material through which the signals emitted from the sensor passes.

12. A lighting device comprising:

a sensor;

a substrate disposed on the sensor and including an electrode pattern;

a light source disposed on the substrate and electrically connected to the electrode pattern;

a resin layer disposed on the substrate;

a reflective layer disposed between the substrate and the resin layer and having a plurality of unit reflective patterns; and an optical member disposed on the resin layer and including a transmissive region and a non-transmissive region, wherein the substrate includes a first region including a center of the substrate and a second region including an edge of the substrate, wherein the light source is disposed on the second region, and includes first and second light emitting devices disposed to correspond to each other with respect to the center of the substrate and emitting light toward the center of the substrate, wherein a portion of the plurality of unit reflective patterns overlaps the first and second light emitting devices in a second direction defined in a horizontal direction, wherein the plurality of unit reflective patterns is disposed on the first region, wherein the sensor overlaps the first region in a first direction perpendicular to the second direction, and does not overlap the electrode pattern in the first direction, wherein the optical member is spaced apart from the resin layer, and wherein a separation distance between the resin layer and the optical member.

13. The lighting device of claim 12, wherein the light source includes a plurality of light emitting devices arranged at regular intervals along the edge of the substrate.

14. The lighting device of claim 13, wherein the light source includes a light emitting group defined by a pair of light emitting devices facing each other among the plurality of light emitting devices, and wherein at least one light emitting group is disposed on the substrate.

15. The lighting device of claim 13, wherein the plurality of light emitting devices are disposed along a virtual line forming a polygonal shape, a circular shape, or an elliptical shape.

16. A lighting device comprising:

a sensor;

a substrate disposed on the sensor and including an electrode pattern;

a light source disposed on the substrate and electrically connected to the electrode pattern;

a resin layer disposed on the substrate; and a reflective layer disposed between the substrate and the resin layer, wherein the reflective layer includes first to third reflective pattern groups disposed along first to third virtual lines forming a polygon, circle, or ellipse, wherein the second line is disposed inside the first line, and the third line is disposed inside the second line, wherein a minimum interval between the first and second reflective pattern groups is greater than a minimum interval distance between the second and third reflective pattern groups, and wherein the sensor does not overlap the electrode pattern and the light source in a vertical direction.

17. The lighting device of claim 16, wherein the first reflective pattern group includes a plurality of first unit reflective patterns disposed along the first line, wherein the second reflective pattern group includes a plurality of second unit reflective patterns disposed along the second line, and wherein the third reflective pattern group includes a plurality of third unit reflective patterns disposed along the third line.

18. The lighting device of claim 17, wherein a size of the first unit reflective patterns is smaller than a size of the second unit reflective patterns, and wherein the size of the second unit reflective patterns is smaller than a size of the third unit reflective patterns.

19. The lighting device of claim 17, wherein a density of the third unit reflective patterns included in the third reflective pattern group is greater than a density of the second unit reflective patterns included in the second reflective pattern group, and wherein the density of the second unit reflective patterns included in the second reflective pattern group is greater than a density of the second unit reflective patterns included in the first reflective pattern group.

20. The lighting device of claim 17, wherein a distance between the plurality of first reflective patterns on a center of the substrate is constant or varies in a clockwise direction.

\* \* \* \* \*